(12) United States Patent
Chen et al.

(10) Patent No.: US 8,804,425 B2
(45) Date of Patent: Aug. 12, 2014

(54) SELECTED WORD LINE DEPENDENT PROGRAMMING VOLTAGE

(75) Inventors: Wenzhou Chen, San Jose, CA (US);
Guirong Liang, Santa Clara, CA (US);
Lanlan Gu, San Jose, CA (US); Bo Lei,
San Ramon, CA (US)

(73) Assignee: SanDisk Technologies Inc., Plano, TX (US)

( * ) Notice: Subject to any disclaimer, the term of this patent is extended or adjusted under 35 U.S.C. 154(b) by 145 days.

(21) Appl. No.: 13/430,480

(22) Filed: Mar. 26, 2012

(65) Prior Publication Data
US 2013/0250688 A1    Sep. 26, 2013

(51) Int. Cl.
*G11C 16/04*    (2006.01)

(52) U.S. Cl.
USPC .............. 365/185.17; 365/185.18; 365/185.19

(58) Field of Classification Search
USPC .............. 365/185.17–185.19, 185.21, 185.03
See application file for complete search history.

(56) References Cited

U.S. PATENT DOCUMENTS

| | | | |
|---|---|---|---|
| 5,608,679 A | 3/1997 | Mi et al. | |
| 6,661,724 B1 | 12/2003 | Snyder et al. | |
| 6,987,703 B2 | 1/2006 | Tanaka | |
| 7,020,017 B2 | 3/2006 | Chen et al. | |
| 7,139,192 B1 | 11/2006 | Wong | |
| 7,295,478 B2 | 11/2007 | Wan et al. | |
| 7,468,919 B2 | 12/2008 | Sekar et al. | |
| 7,499,324 B2 | 3/2009 | Cernea et al. | |
| 7,596,031 B2 | 9/2009 | Hemink et al. | |
| 7,691,710 B2 | 4/2010 | Mokhlesi et al. | |
| 7,764,542 B2 * | 7/2010 | Edahiro et al. | 365/185.03 |
| 8,547,744 B2 * | 10/2013 | Namiki et al. | 365/185.17 |
| 8,553,465 B2 * | 10/2013 | Park | 365/185.28 |
| 2002/0141236 A1 | 10/2002 | Nakai et al. | |
| 2008/0316833 A1 | 12/2008 | Fong et al. | |
| 2009/0086544 A1 | 4/2009 | Mokhlesi et al. | |
| 2010/0322005 A1 | 12/2010 | Dong et al. | |
| 2011/0228608 A1 | 9/2011 | Shiino et al. | |

OTHER PUBLICATIONS

International Search Report and Written Opinion of the International Searching Authority dated Feb. 28, 2013, PCT Application No. PCT/US2012/066614 filed Nov. 27, 2012, 9 pages.

* cited by examiner

*Primary Examiner* — David Lam
(74) *Attorney, Agent, or Firm* — Vierra Magen Marcus LLP

(57) ABSTRACT

Methods and devices for operating non-volatile storage are disclosed. One or more programming conditions depend on the word line that is selected for programming. Applying a selected word line dependent program condition may reduce or eliminate program disturb. The duration of a programming pulse may depend on the word line that is selected for programming. This could be a physical characteristic of the word line or its location on a NAND string. As one example, a shorter pulse width may be used for the programming signal when programming edge word lines.

21 Claims, 28 Drawing Sheets

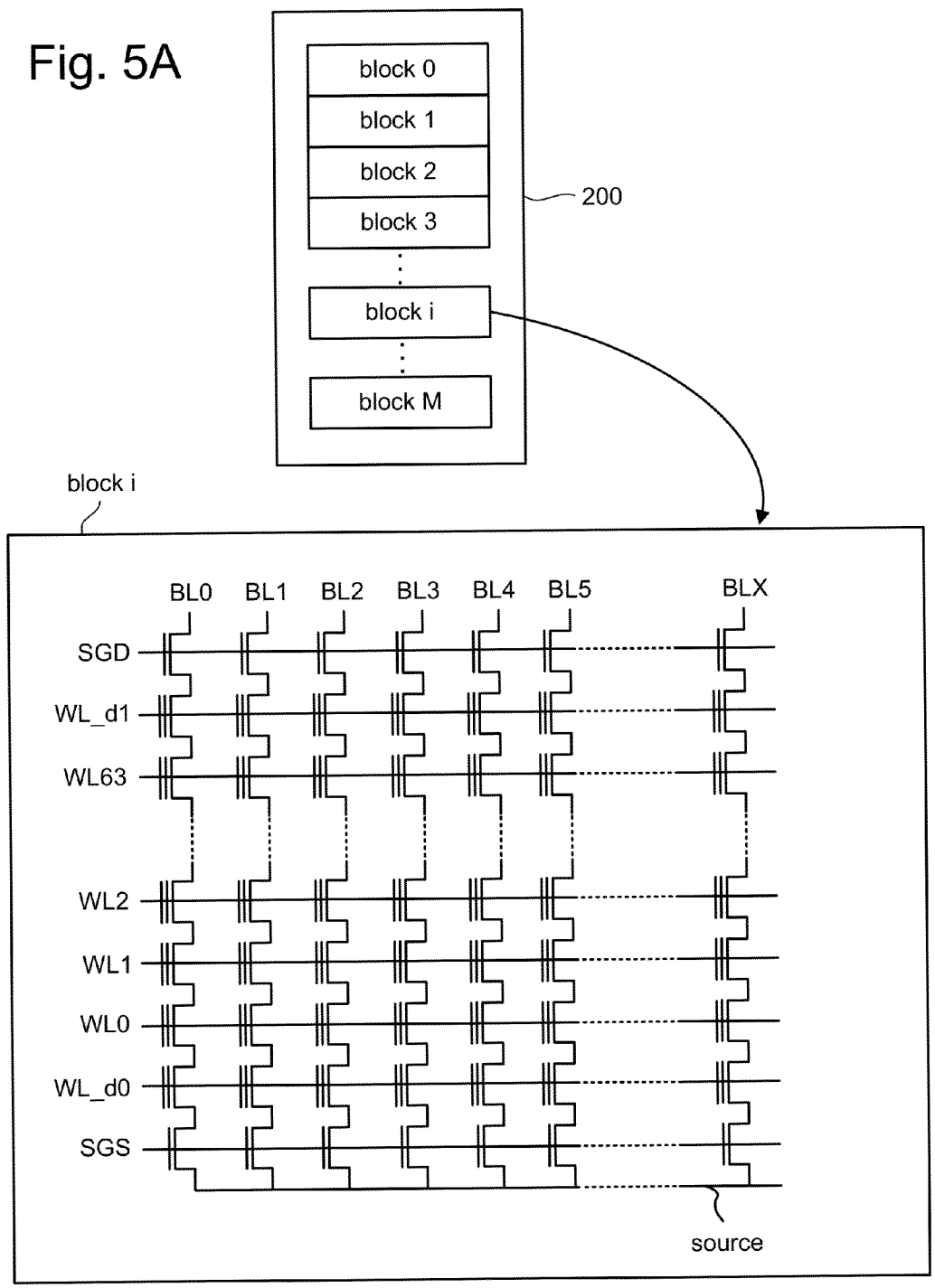

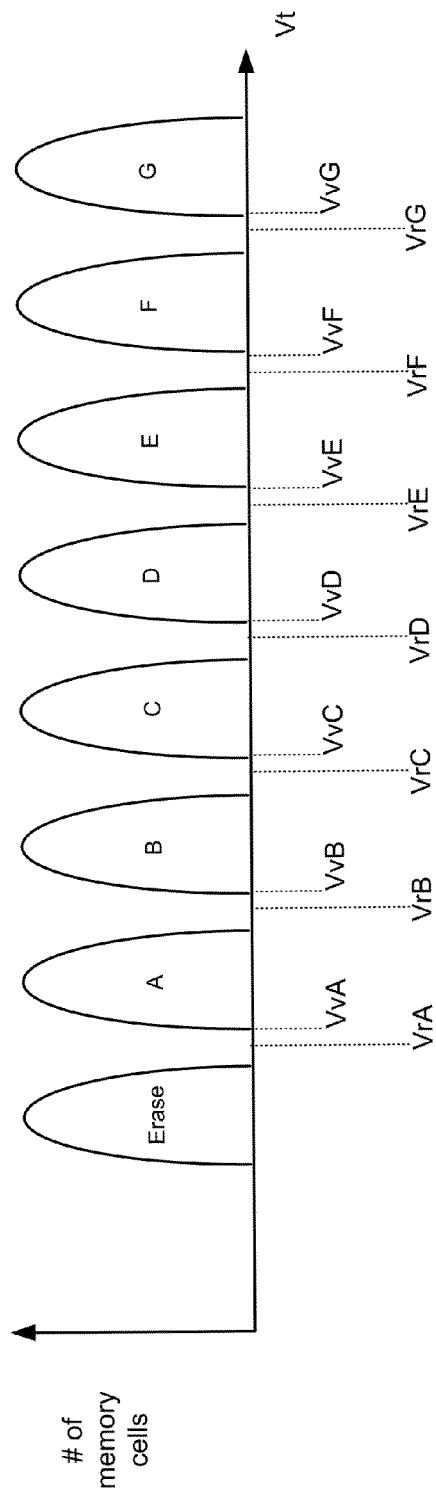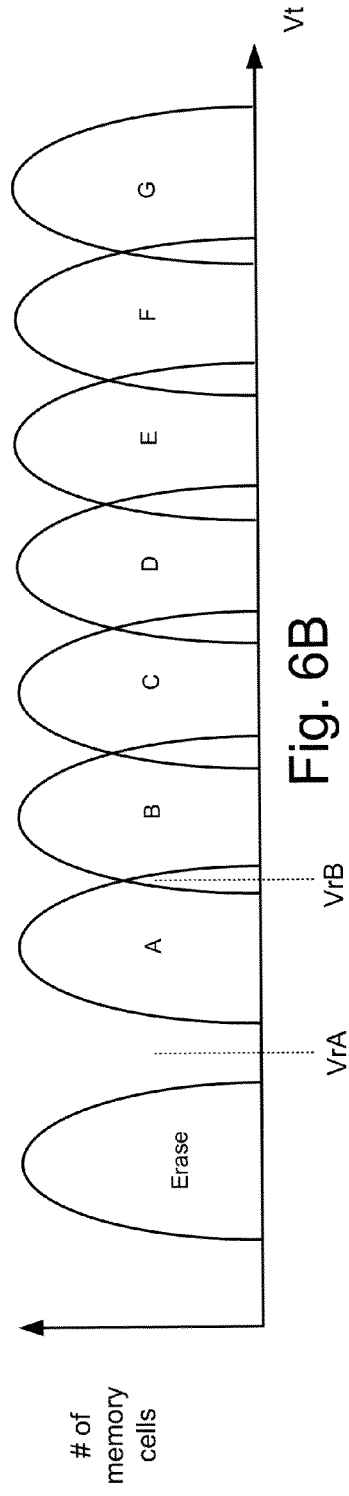

1400

Apply a programming voltage to a selected word line that has a duration that depends on the width of the selected word line — 1402

Apply a programming signal having first pulse width to lowest word line — 1502

Apply a programming signal to middle word line having a second pulse width that is longer than the first pulse width — 1504

Apply a programming signal to highest word line having a third pulse width that is shorter than the second pulse width — 1506

Determine width of program pulse for selected word line — 1602

Apply a programming signal with that width to selected word line — 1604

Yes ← More word lines? — No → Done

Fig. 16

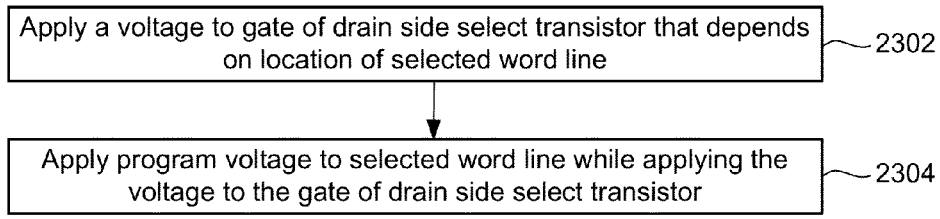
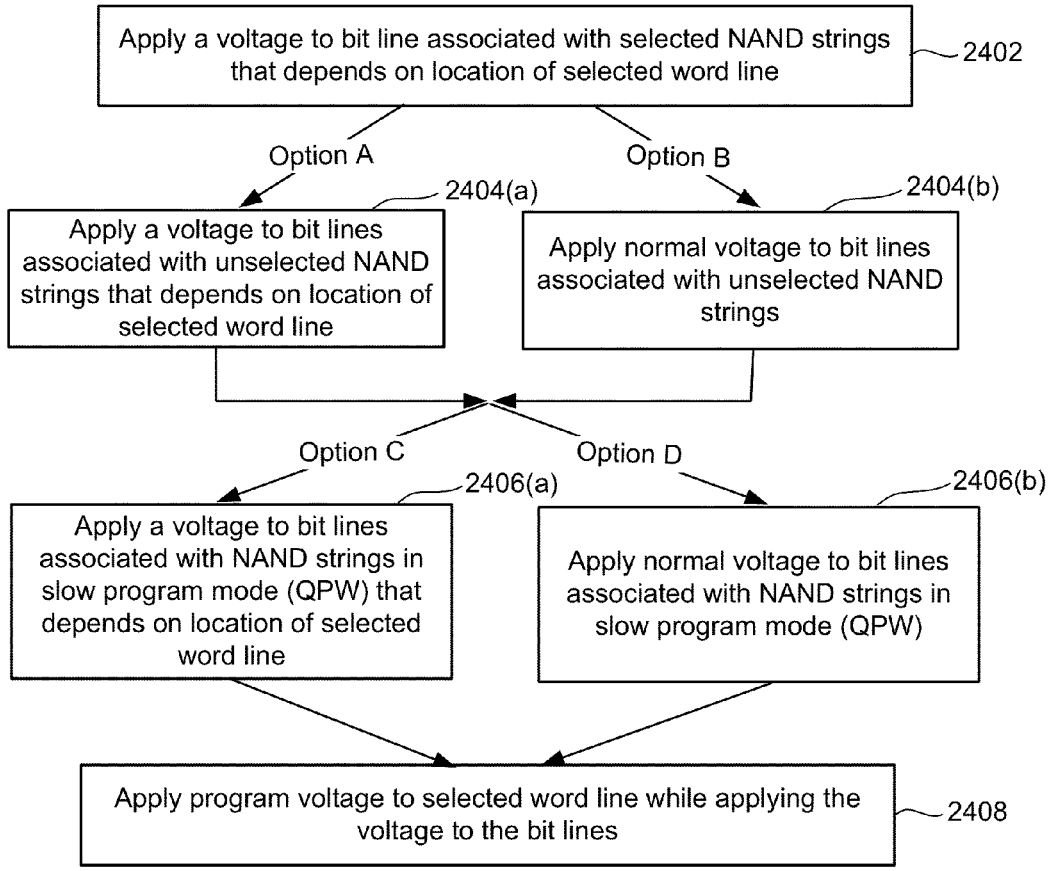

SELECTED WORD LINE DEPENDENT PROGRAMMING VOLTAGE

BACKGROUND

The present disclosure relates to non-volatile storage.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the drain and source diffusion regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its drain and source is controlled by the level of charge on the floating gate.

In a NAND architecture, memory cells are arranged as NAND strings. A NAND string includes memory cells (each including a floating gate) connected in series over a substrate. At each end of the NAND string there is a select transistor (also referred to as a select gate). One of the select transistors (source side select transistor) connects/disconnects the NAND string to a source line that is common to a large group of NAND strings. Each NAND string is associated with one bit line. The other select transistor (drain side select transistor) connects/disconnects its NAND string to a bit line. In one approach, a memory cell on a NAND string may be read by applying a voltage to its control gate and sensing a signal on the bit line.

Typically, a program voltage $V_{PGM}$ applied to the control gate during a program operation is applied as a series of pulses that increase in magnitude as programming progresses. In one possible approach, the magnitude of the pulses is increased with each successive pulse by a predetermined step size, e.g., 0.2-0.4 V. $V_{PGM}$ can be applied to the control gates of flash memory cells. In the periods between the program pulses, verify operations are carried out. That is, the programming level of each element of a group of cells being programmed in parallel is read between successive programming pulses to determine whether it is equal to or greater than a verify level to which the element is being programmed.

After a given memory cell on the word line selected for programming reaches its intended threshold voltage, programming may be inhibited for that memory cell. In one approach, programming is inhibited by applying an inhibit voltage to the bit line associated with the NAND string. The voltage applied to the gate of the drain side select transistor should be low enough to keep the transistor off, such that the channel of an inhibited NAND string may float. Likewise, the voltage applied to the gate of the source side select transistor should be low enough to keep the transistor off, such that the channel of an inhibited NAND string may float. Also, a voltage is applied to control gates of unselected memory cells, which boosts the voltage in the channel region of the memory cells on inhibited NAND strings. This boosted channel voltage helps to reduce or eliminate program disturb.

However, it is possible for the channel voltage of the inhibited NAND strings to drop, which can result in program disturb. One possible reason for the drop in channel voltage is leakage of current from a boosted channel. For example, the current could leak across the channel of either select transistor.

One type of leakage is due to punch-through conduction across a select transistor. Punch-through conduction may occur due to the difference in the drain to source voltage across the channel of a select gate transistor. As memory arrays continue to scale down in size, the channel length of select gate transistors is getting shorter. Therefore, short channel effects such as punch-through conduction may become more problematic.

Another type of leakage from the channel of inhibited NAND strings may arise due to drain induced barrier lowering (DIBL). DIBL may cause the $V_{TH}$ of the select transistors to drop. If the $V_{TH}$ of a select transistor of an inhibited NAND string is lowered enough, it may turn on, at least weakly. If this happens, then current may leak from the boosted channel across the channel of the select transistor, thereby discharging the voltage of the NAND string channel. Consequently, program disturb could occur.

Gate induced drain leakage (GIDL) is another problem that may cause program disturb. GIDL refers to charge carriers leaking into the channel from a select transistor as a result of a voltage applied to the gate of one of the select transistors. These charge carriers (e.g., electrons) may be accelerated in an E-field in the channel of the NAND string. Program disturb may result due to hot carrier injection of the electrons from the channel to a floating gate of a memory cell.

It is desirable to prevent or reduce program disturb, which may arise from a variety of causes including, but not limited to, punch-through conduction, DIBL, and GIDL.

BRIEF DESCRIPTION OF THE DRAWINGS

FIG. 5A depicts an exemplary structure of memory cell array.

FIG. 6A depicts an example set of Vt distributions.

FIG. 6B depicts an example set of Vt distributions.

FIG. 14 is a flowchart of one embodiment of a process of programming non-volatile storage using a programming voltage having a pulse width that depends on the width of the selected word line.

FIG. 15 is a flowchart of one embodiment of a process of programming non-volatile storage using a programming voltage having a pulse width that depends on the location of the selected word line.

FIG. 16 is a flowchart of one embodiment of a process of programming non-volatile storage that involves determining a width of a program pulse.

FIG. 23A depicts a flowchart of one embodiment of a process of programming non-volatile storage in which the magnitude of the voltage SGD depends on the location of the selected word line.

FIG. 24 depicts a flowchart of one embodiment of a process of programming non-volatile storage in which a voltage applied to bit lines depends on the location of the selected word line.

DETAILED DESCRIPTION

Figure 1A:
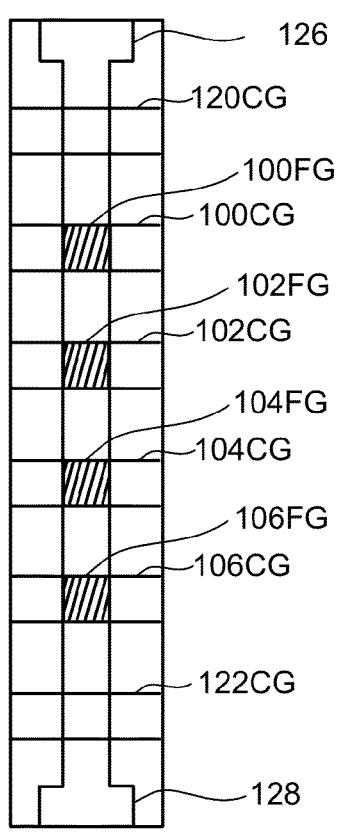
FIG. 1A is a top view of a NAND string.

The present disclosure provides methods and devices for operating non-volatile storage. In some embodiments, one or more programming conditions depend on the location of the word line that is selected for programming. Applying selected word line dependent program conditions may reduce or eliminate program disturb.

A word line may be considered to be an "edge word line" or a "middle word line." An "edge word line" is defined herein as those within "n" word lines of the lowest or highest word line that is used to store user or system data. At least the lowest and highest word lines used to store user or system data are considered to be edge word lines. There may be one or more edge word lines at each end of a NAND string. The word lines that are considered to be edge word lines are not necessarily fixed for a given memory array. Rather, the particular context may determine whether a word line is considered to be an edge word line. A "middle word line" is defined herein as any word line that is used to store user or system data other than edge word lines.

In one embodiment, the width (or duration) of a programming pulse depends on the word line that is selected for programming. In one embodiment, the duration of a programming pulse depends on a physical characteristic of the selected word line, such as its width. In one embodiment, the duration of a programming pulse depends on the location of the selected word line on a NAND string. As one example, a shorter pulse width may be used for the programming signal when programming edge word lines.

In one embodiment, the voltage applied to a common source line depends on the location of the word line that is selected for programming. This may prevent or reduce punch-through conduction, which may depend on the location of the selected word line. In one embodiment, the voltage applied to the common source line is higher for lower selected word lines than the voltage used for higher selected word lines.

In one embodiment, the voltage applied to bit lines of unselected NAND strings depends on the location of the word line that is selected for programming. This may prevent or reduce punch-through conduction, which may depend on the location of the selected word line. In one embodiment, the voltage applied to bit lines associated with unselected NAND strings is higher for lower selected word lines than the voltage used for higher selected word lines. In one embodiment, a higher voltage is used when programming edge word lines that are near the drain end of the NAND string.

In one embodiment, the voltage applied to the gate of a select transistor of a NAND string depends on the location of the word line that is selected for programming. This could be either a source side or drain side select transistor. This may prevent or reduce program disturb that could result due to DIBL. In one embodiment, a negative bias is applied to the gate of a source side select transistor when programming at least some of the word lines. In one embodiment, progressively lower voltages are used for the gate of the drain side select transistor when programming progressively higher word lines.

In one embodiment, the voltage applied to the gate of a source side select transistor depends on the location of the word line that is selected for programming. This may prevent or reduce GIDL, which may depend on the location of the selected word line. In one embodiment, the voltage applied to the gate of a drain side select transistor depends on the location of the word line that is selected for programming. This may prevent or reduce GIDL, which may depend on the location of the selected word line. In one embodiment, a higher voltage is applied to the gate of a select transistor when the selected word line is an edge word line near that select transistor.

In one embodiment, the voltage applied to one or more bit lines depends on the location of the word line that is selected for programming. This may further help to prevent or reduce program disturb associated with GIDL. In one embodiment, the voltage applied to one or more bit lines associated with selected NAND strings depends on the location of the word line that is selected for programming. In one embodiment, the voltage applied to one or more bit lines associated with unselected NAND strings depends on the location of the word line that is selected for programming. In one embodiment, the voltage applied to one or more bit lines associated with NAND strings in a slow programming mode depends on the location of the word line that is selected for programming.

Figure 1B:
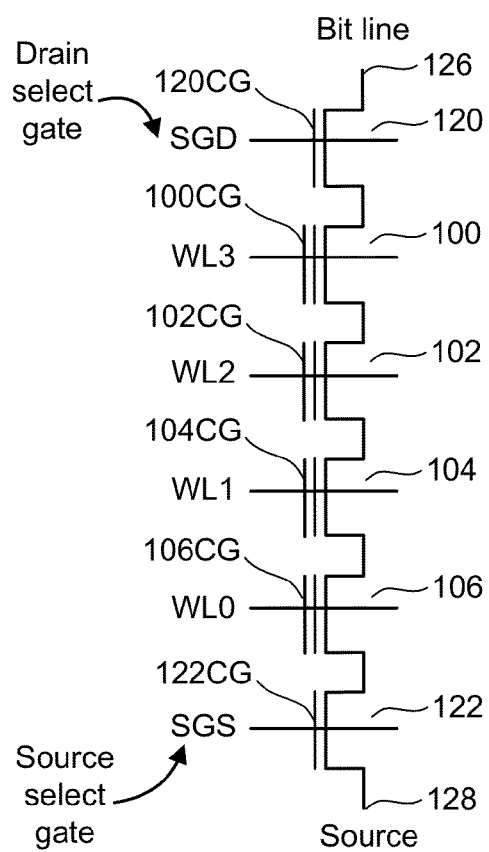
FIG. 1B is an equivalent circuit diagram of the NAND string of FIG. 1A.

One example of a memory system suitable for implementing embodiments uses a NAND flash memory structure, which includes arranging multiple transistors in series between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1A and 1B. Select gate 120 is connected to select line SGD. Select gate 122 is connected to select line SGS. In one embodiment, select gates 120 and 122 are each implemented with a "select transistor." Thus, select gate 120 may be referred to as a "drain side select transistor," (or SGD transistor) and select gate 122 may be referred to as a "source side select transistor" (or SGS transistor).

Figure 2:
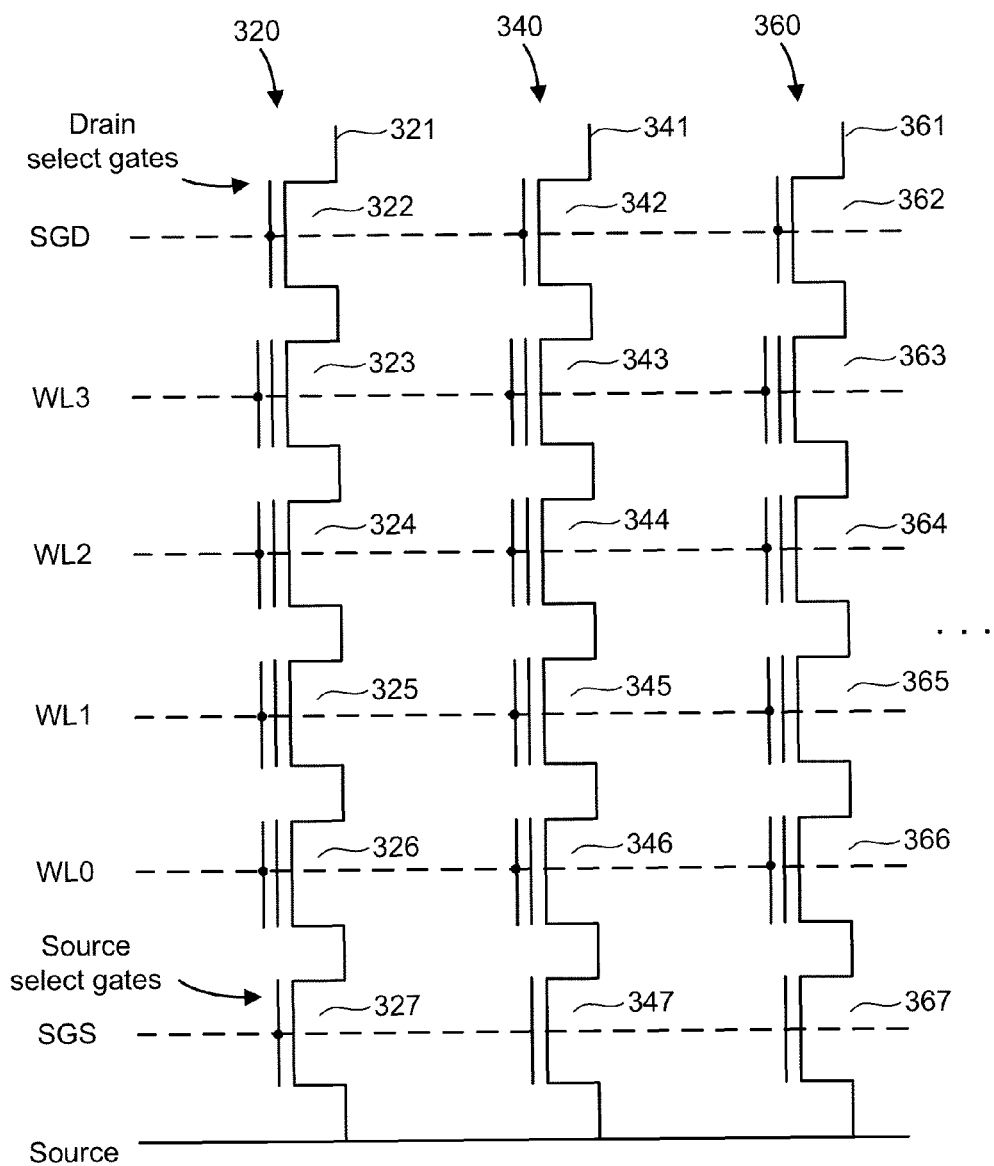
FIG. 2 is a circuit diagram depicting three NAND strings.

FIG. 2 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have thirty-two, sixty-four, or more storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. In one embodiment, the various NAND strings 320, 340 and 360 are connected to respective bit lines 321, 341 and 361, by select transistors. In one embodiment, the select transistors are in the select gates 322, 342, 362, etc. In one embodiment, the select transistors form the select gates 322, 342, 362. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. Nos. 6,222,762 and 7,237,074, both of which are incorporated herein by reference in their entirety, describe various data encoding schemes for multi-state flash storage elements.

Relevant examples of NAND type flash memories and their operation are provided in U.S. Pat. Nos. 5,386,422; 5,570,315; 5,774,397; 6,046,935; 6,456,528; and 6,522,580, each of which is incorporated herein by reference.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2, the program voltage will also be applied to the control gates of storage elements 344 and 364.

Figure 3:
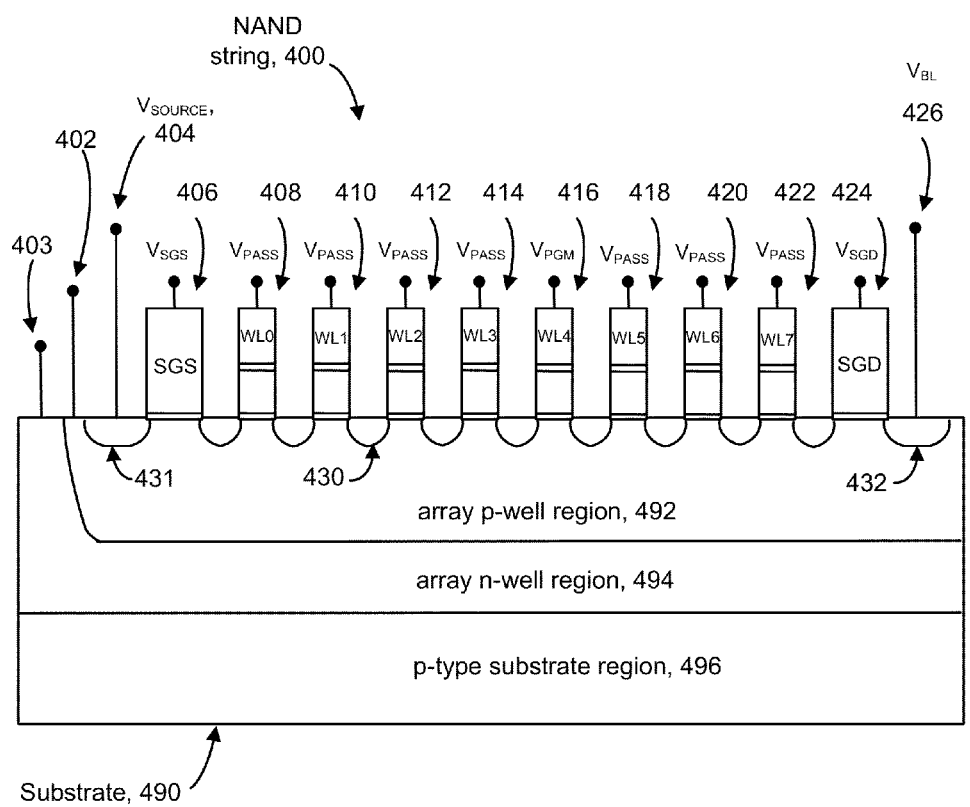
FIG. 3 depicts a cross-sectional view of a NAND string formed on a substrate.

FIG. 3 depicts a cross-sectional view of a NAND string formed on a substrate. The view is simplified and not to scale. The NAND string 400 includes a source-side select gate (or SGS transistor) 406, a drain-side select gate (or SGD transistor) 424, and eight storage elements 408, 410, 412, 414, 416, 418, 420 and 422, formed on a substrate 490. A number of source/drain regions, one example of which is source drain/region 430, are provided on either side of each storage element. In one embodiment, the substrate 490 employs a triple-well technology which includes an array p-well region 492 within an array n-well region 494, which in turn is within a p-type substrate region 496. The NAND string and its non-volatile storage elements can be formed, at least in part, on the array p-well region 492.

A voltage $V_{SOURCE}$ is provided to a source line contact 404. The source line contact has an electrical connection to the diffusion region 431 of SGS transistor 406. A bit line voltage $V_{BL}$ is supplied to bit line contact 426, which is in electrical contact with the diffusion region 432 of SGD transistor 424. Note that diffusion region 431 may be referred to herein as a source. Note that diffusion region 432 may be referred to herein as a drain; however, it will be understood that under some conditions (such as when the voltage of the channel of the NAND string is boosted) the diffusion region 432 may be at a lower voltage than the terminal on the other side of the channel of the SGD transistor 424. Voltages, such as body bias voltages, can also be applied to the array p-well region 492 via a terminal 402 and/or to the array n-well region 494 via a terminal 403.

During a program operation, a control gate voltage $V_{PGM}$ is provided on a selected word line, in this example, WL3, which is associated with storage element 414. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, $V_{PASS}$ is applied to the remaining word lines associated with NAND string 400, in one possible boosting scheme. $V_{SGS}$ and $V_{SGD}$ are applied to the select gates 406 and 424, respectively.

Figure 4:
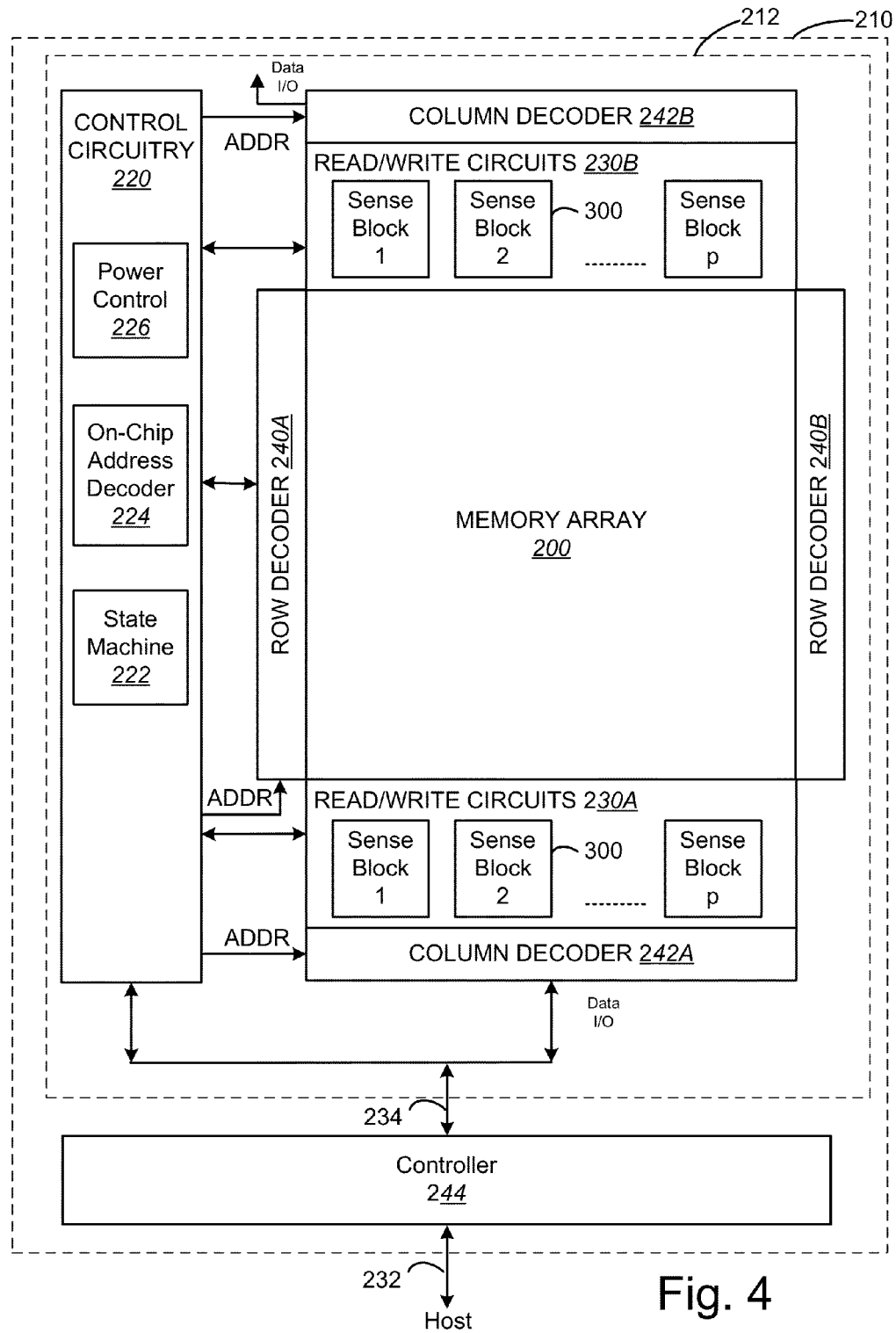
FIG. 4 illustrates a non-volatile storage device.

FIG. 4 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

FIG. 5A depicts an example structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. In one embodiment, the controller 244 is able to correct a certain number of misreads, based on the ECC.

Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5A shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and two dummy memory cells. Data memory cells can store user or system data. Dummy memory cells are typically not used to store user or system data. Some embodiments do not include dummy memory cells.

Figure 5B:
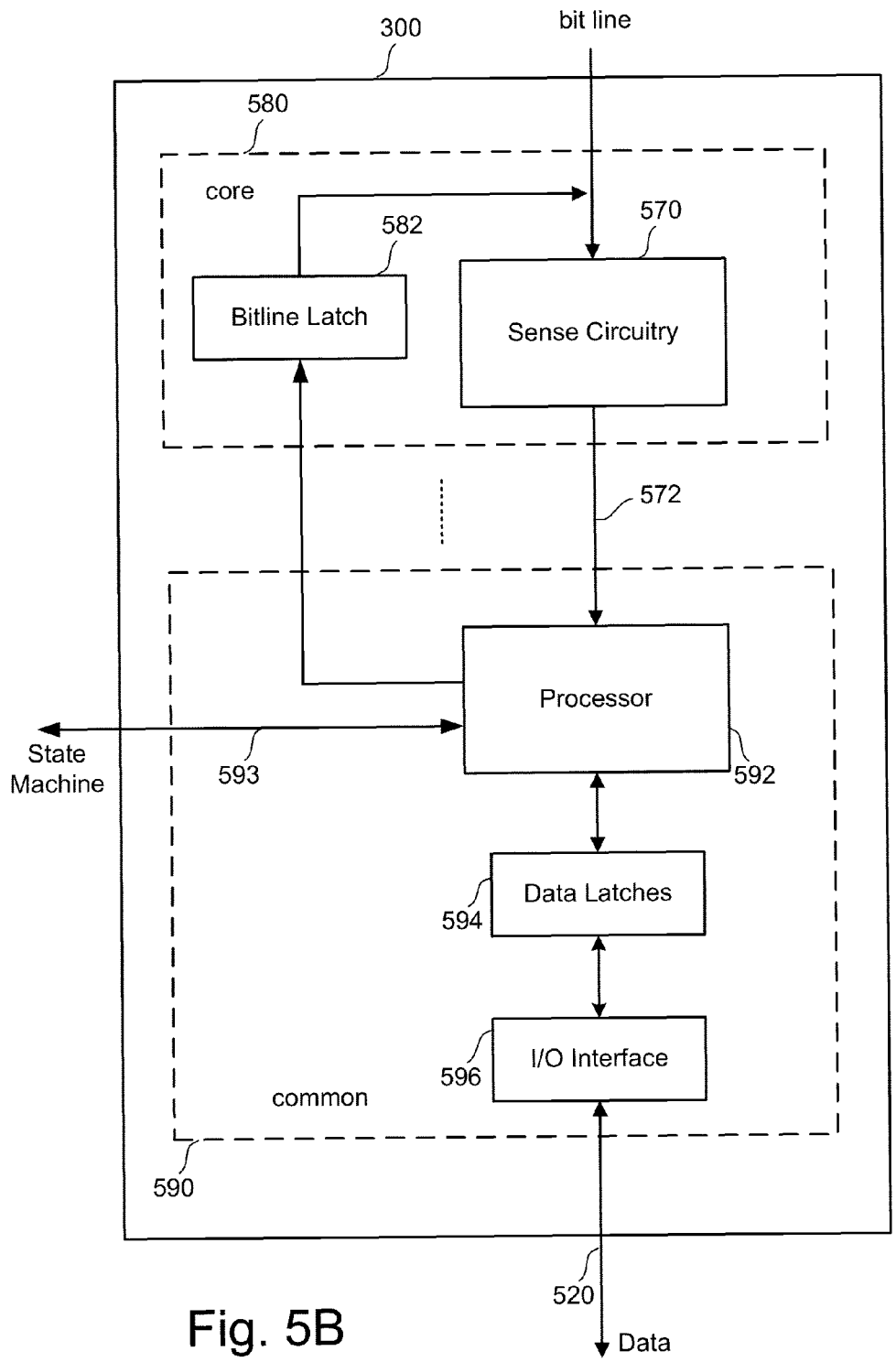
FIG. 5B is a block diagram of an individual sense block.

FIG. 5B is a block diagram of an individual sense block 300 partitioned into a core portion, referred to as a sense module 580, and a common portion 590. In one embodiment, there will be a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572. For further details, refer to U.S. Patent Application Publication 2006/0140007, which is incorporated herein by reference in its entirety.

Sense module 580 comprises sense circuitry 570 that determines whether a conduction current in a connected bit line is above or below a predetermined threshold level. In some embodiments, sense module 580 includes a circuit commonly referred to as a sense amplifier. Sense module 580 also includes a bit line latch 582 that is used to set a voltage condition on the connected bit line. For example, a predetermined state latched in bit line latch 582 will result in the connected bit line being pulled to a state designating program inhibit (e.g., $V_{DD}$).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed memory cell and store the determined data in the set of data latches. The set of data latches 594 is used to store data bits determined by processor 592 during a read operation. Data latches 594 may also be used to store data bits imported from the data bus 520 during a program operation. The imported data bits represent write data meant to be programmed into the memory. I/O interface 596 provides an interface between data latches 594 and the data bus 520.

During read or sensing, the operation of the system is under the control of state machine 222 that controls the supply of different control gate voltages to the addressed cell. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves double duty, both as a latch for latching the output of the sense module 580 and also as a bit line latch as described above.

It is anticipated that some implementations will include multiple processors 592. In one embodiment, each processor 592 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 592 to accumulate the results of the associated bit lines such that the state machine need only read the wired-OR line one time.

During program or verify, the data to be programmed is stored in the set of data latches 594 from the data bus 520. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 592 monitors the verified memory state relative to the desired memory state. When the two are in agreement, processor 592 sets the bit line latch 582 so as to cause the bit line to be pulled to a state designating program inhibit. This inhibits the cell coupled to the bit line from further programming even if it is subjected to programming pulses on its control gate. In other embodiments the processor initially loads the bit line latch 582 and the sense circuitry sets it to an inhibit value during the verify process. In one embodiment, the magnitude of the inhibit value depends on the location of the selected word line.

Data latch stack 594 contains a stack of data latches corresponding to the sense module. In one embodiment, there are 3-5 (or another number) data latches per sense module 580. In one embodiment, the latches are each one bit. In some implementations (but not required), the data latches are implemented as a shift register so that the parallel data stored therein is converted to serial data for data bus 520, and vice versa. In one embodiment, all the data latches corresponding to the read/write block of M memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Pat. No. 7,046,568, "Memory Sensing Circuit and Method for Low Voltage Operation; (4) U.S. Pat. No. 7,196,928, "Compensating for Coupling During Read Operations of Non-Volatile Memory," and (5) U.S. Pat. No. 7,327,619, "Reference Sense Amplifier For Non-Volatile Memory". All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example Vt distributions corresponding to data states for the memory cell array when each memory cell stores three bits of data. Other embodiment, however, may use more or fewer than three bits of data per memory cell.

FIG. 6A shows eight Vt distributions corresponding to an Erase state and programmed states A-G. In one embodiment, the threshold voltages in the Erase state are negative and the threshold voltages in the programmed states A-G are positive.

However, the threshold voltages in one or more of programmed states A-G may be negative. Thus, in one embodiment, at least VrA is negative. Other voltages such as VvA, VrB, VvB, etc., may also be negative.

Between each of the data states are read reference voltages used for reading data from memory cells. For example, FIG. 6A shows read reference voltage VrA between the erase state and the A-state, and VrB between the A-state and B-state. By testing whether the threshold voltage of a given memory cell is above or below the respective read reference voltages, the system can determine what state the memory cell is in.

At or near the lower edge of each programmed state are verify reference voltages. For example, FIG. 6A shows VvA for the A-state and VvB for the B-state. When programming memory cells to a given state, the system will test whether those memory cells have a threshold voltage greater than or equal to the verify reference voltage.

FIG. 6B illustrates that Vt distributions can partially overlap since the error correction algorithm can handle a certain percentage of cells that are in error. Note that in some embodiments, at one point in time the threshold voltage distribution may resemble FIG. 6A and at another time the threshold voltage distributions may overlap, as in FIG. 6B. For example, just after programming, the threshold voltage distribution may resemble FIG. 6A. However, over time, the threshold voltages of memory cells may shift, such that there may be overlap.

Also note that contrary to the equal spacing/width of the depicted threshold voltage distributions, various distributions may have different widths/spacings in order to accommodate varying amounts of susceptibility to data retention loss.

Figure 7A:
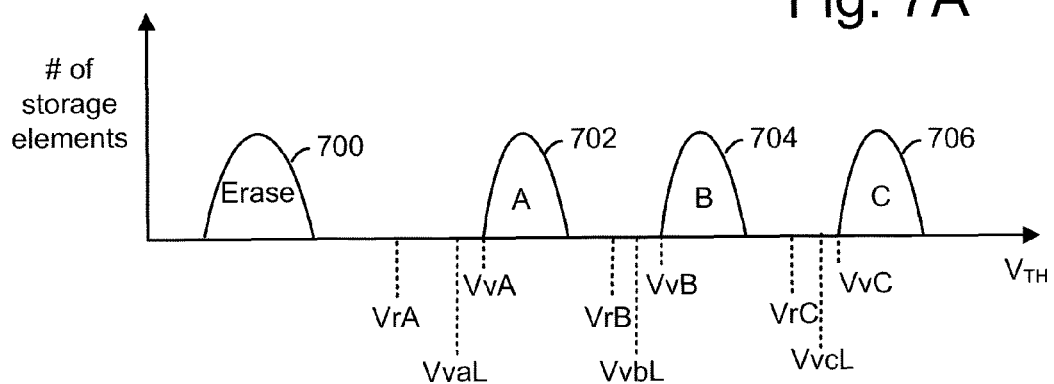
FIG. 7A depicts an example set of threshold voltage distributions for a four-state memory device in which each storage element stores two bits of data.

In some embodiments, a "verify low" and a "verify high" reference voltage is used. FIG. 7A depicts an example set of threshold voltage distributions for a four-state memory device in which each storage element stores two bits of data. A first threshold voltage distribution 700 is provided for erased (Erased-state) storage elements. Three threshold voltage distributions 702, 704 and 706 represent programmed states A, B and C, respectively. In one embodiment, the threshold voltages in the Erased-state are negative, and the threshold voltages in the A-, B- and C-states are positive.

Read reference voltages, VrA, VrB and VrC, are also provided for reading data from storage elements. By testing whether the threshold voltage of a given storage element is above or below VrA, VrB and VrC, the system can determine the state, e.g., the storage element is in.

Further, verify reference voltages, VvA, VvB, and VvC are provided. When programming storage elements to the A-state, B-state or C-state, the system will test whether those storage elements have a threshold voltage greater than or equal to VvA, VvB or VvC, respectively. In one embodiment, "verify low" reference voltages, VvaL, VvbL, and VvcL are provided. Similar "verify low" reference voltages could also be used in embodiments with a different number of states.

Figure 7B:
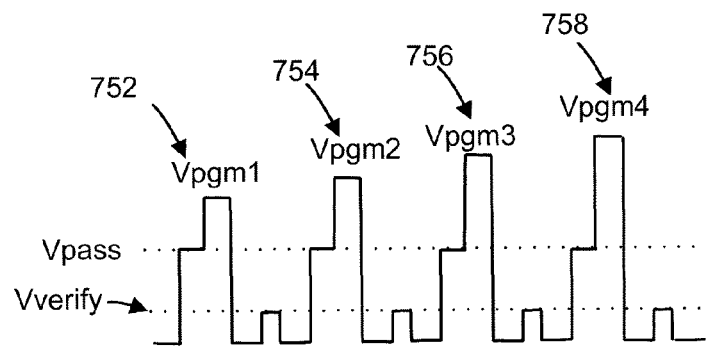
FIG. 7B shows a series of program pulses that may be used to program a distribution of FIG. 7A.

In full sequence programming, storage elements can be programmed from the Erased-state directly to any of the programmed states A, B or C. For example, a population of storage elements to be programmed may first be erased so that all storage elements in the population are in the Erased-state. A series of program pulses such as depicted in FIG. 7B is used to program storage elements directly into the A-, B- and C-states. While some storage elements are being programmed from the Erased-state to the A-state, other storage elements are being programmed from the Erased-state to the B-state and/or from the Erased-state to the C-state. Note that using a full sequence programming is not required.

One example of a slow programming mode uses low (offset) and high (target) verify levels for one or more data states. For example, VvaL and VvA are offset and target verify levels, respectively, for the A-state, and VvbL and VvB are offset and target verify levels, respectively, for the B-state. During programming, when the threshold voltage of a storage element which is being programmed to the A-state as a target state (e.g., an A-state storage element) exceeds VvaL, its programming speed is slowed, such as by raising the bit line voltage to a level, e.g., 0.6-0.8 V, which is between a nominal program or non-inhibit level, e.g., 0 V and a full inhibit level, e.g., 2-3 V. The middle value may be referred to as a quick pass write (QPW) value. This provides greater accuracy by avoiding large step increases in threshold voltage. In some embodiments, values for one or more of the nominal program value, QPW value, and/or the inhibit value depend on the location of the word line that is selected for programming.

When the threshold voltage reaches VvA, the storage element is locked out from further programming. Similarly, when the threshold voltage of a B-state storage element exceeds VvbL, its programming speed is slowed, and when the threshold voltage reaches VvB, the storage element is locked out from further programming. In one approach, a slow programming mode is not used for the highest state since some overshoot is typically acceptable. Instead, the slow programming mode can be used for the programmed states, above the erased state, and below the highest state.

Moreover, in the example programming techniques discussed, the threshold voltage of a storage element is raised as it is programmed to a target data state. However, programming techniques can be used in which the threshold voltage of a storage element is lowered as it is programmed to a target data state. Programming techniques which measure storage element current can be used as well. The concepts herein can be adapted to different programming techniques.

FIG. 7B depicts a series of program and verify pulses which are applied to a selected word line during a programming operation. A programming operation may include multiple programming iterations, where each iteration applies one or more program pulses (voltages) followed by one or more verify voltages, to a selected word line. In one possible approach, the program voltages are stepped up in successive iterations. Moreover, the program voltages may include a first portion which has a pass voltage (Vpass) level, e.g., 6-8 V, followed by a second portion at a program level, e.g., 12-25 V. For example, first, second, third and fourth program pulses 752, 754, 756 and 758 have program voltages of Vpgm1, Vpgm2, Vpgm3 and Vpgm4, respectively, and so forth. A set of one or more verify voltages may be provided after each program pulse. In some embodiments, there may be two or more verify pulses between the program pulses. For example, one pulse might be used to verify the A-state and the B-state, a second may be used to verify the C-state and a D-state, etc. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance.

Figure 8:
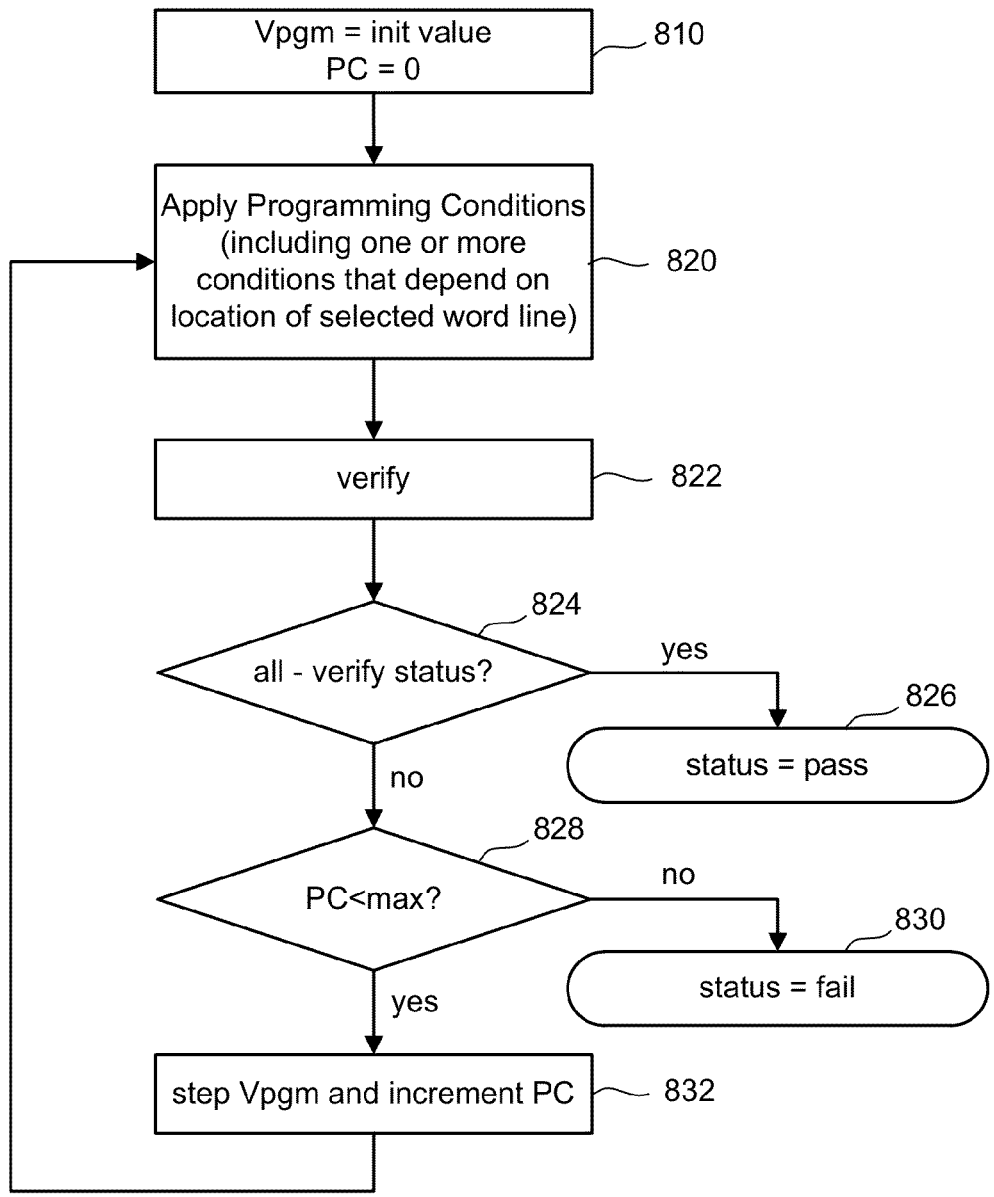
FIG. 8 is a flowchart describing one embodiment of a programming process.

FIG. 8 is a flowchart describing one embodiment of a programming process, which includes one or more verification steps. In one embodiment, the process is used to program memory cells on a selected word line. In one embodiment, the process is used to program every memory cell on the selected word line. In one embodiment, the process is used to program every other memory cell (e.g., odd/even programming) on the selected word line.

In step 810, the program voltage (Vpgm) is set to an initial value. In one embodiment, the magnitude of the program voltage depends on which word line is selected for programming. In one embodiment, the initial magnitude of Vpgm is lower when programming an edge word line. Also, in step 810, a program counter (PC) is initialized to zero.

Figure 9:
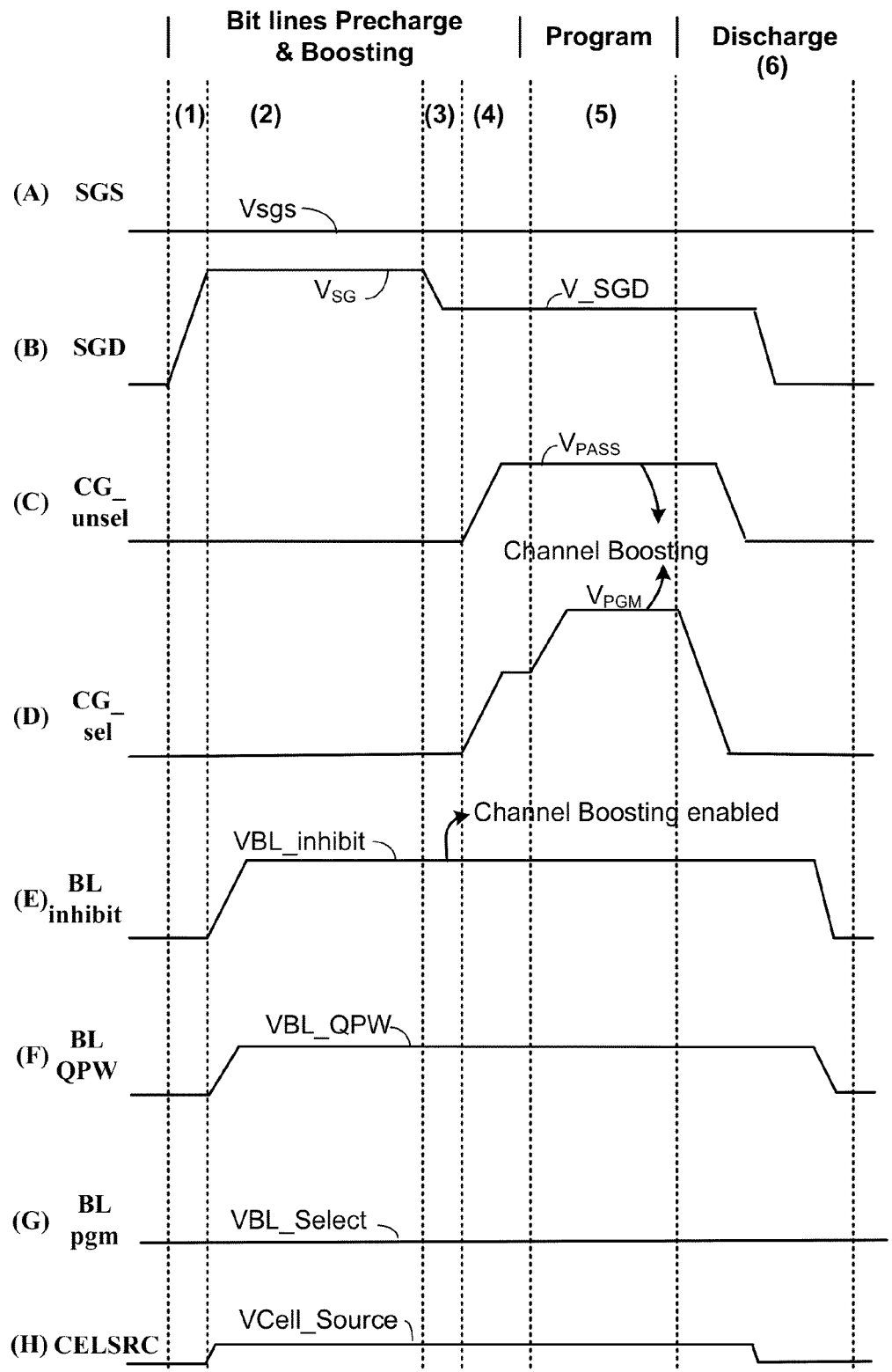
FIGS. 9(A)-9(H) are timing diagrams illustrating voltages during program operations, according to one embodiment.

In step 820, programming conditions are applied. One or more of the programming conditions may depend on the location of which word line is selected for programming. FIG. 9, to be discussed below, shows some examples of programming conditions that may be applied during step 820.

Applying the programming conditions includes applying a programming signal (e.g., voltage pulse) to a selected word line. In one embodiment, the width of the voltage pulse depends on the location of the selected word line on the NAND string. In one embodiment, the voltage pulse has a shorter width when an edge word line is selected for programming than when one of the middle word lines is selected.

Step 820 may also include applying an appropriate voltage to bit lines. In one embodiment, a first voltage (e.g., a low voltage) is applied to bit lines associated with NAND strings having a memory cell presently undergoing normal (or fast) programming, a second voltage (e.g., a medium voltage) is applied to bit lines associated with NAND strings having a memory cell presently undergoing slow programming, and a third voltage (e.g., a high voltage) is applied to bit lines associated with NAND strings having a memory cell presently inhibited from or locked out from further programming. In one embodiment, the magnitude of the first voltage depends on the location of the selected word line along the NAND string. In one embodiment, the magnitude of the second voltage depends on the location of the selected word line along the NAND string. In one embodiment, the magnitude of the third voltage depends on the location of the selected word line along the NAND string.

Step 820 may also include applying an appropriate voltage to a common source line. In one embodiment, the magnitude of the voltage to a common source line depends on the location of the selected word line along the NAND string. Note that the common source line may be in electrical contact with diffusion regions 431 of SGS transistors 406. Thus, in one embodiment, the magnitude of the voltage applied to the (source) diffusion region 431 of an SGS transistor 406 depends on the location of the selected word line along the NAND string.

Step 820 may also include applying an appropriate voltage to a gate of a select gate of a NAND string. Stated another way, step 820 may include applying an appropriate voltage to select line of a NAND string. The select gate may be for either a SGS transistor 406 or a SGD transistor 424. Thus, the select line may be either a source side select line (e.g., SGS) or a drain side select line (e.g., SGD). In one embodiment, the magnitude of the voltage to the gate of a select transistor of a NAND string depends on the location of the selected word line along the NAND string. In other words, the magnitude of the voltage to a select line (SGS and/or SGG) of a NAND string depends on the location of the selected word line along the NAND string.

Applying the program conditions in step 820 may also include applying a pass voltage to unselected word lines. The magnitude of the pass voltage for each unselected word line may depend on which boosting scheme is being used. A variety of boosting schemes including, but not limited to, self-boosting (SB), local self-boosting (LSB), and erase area self-boosting (EASB) may be used. As is known to those of ordinary skill in the art, the magnitude of the pass voltage may be different for different unselected word lines. Also, the magnitude of the pass voltage for a given unselected word line may depend on the relative location of that unselected word line to the word line that is selected for programming. The pass voltage may help to reduce program disturb by boosting the voltage of the channel below the memory cell. Applying programming conditions that depend on the location of the selected word line may prevent or reduce leakage of the boosted channel potential. Therefore, program disturb may be prevented or reduced.

In step 822, a verification process is performed. In one embodiment, the verification is a concurrent coarse/fine verify. Referring to FIG. 7A, as one example, some memory cells that are being programmed to the A-state are verified using the VvaL level, and others that are being programmed to the A-state are verified using the Vva level. During the initial programming steps in which the memory cell's threshold is well below the final level (Vva), course programming may be applied. However, after the memory cell's threshold voltage reaches VvaL, fine programming may be used. Thus, some memory cells are verified for coarse programming, whereas other memory cells are verified for fine programming. Note that when a particular memory cell has been verified as being programmed to its intended state, it may be locked out from further programming. Note that using coarse/fine programming is not required. In one embodiment, the intermediate verify levels (e.g., VvaL, VvbL, etc.) are not used.

In step 824, it is determined whether all or almost all of the memory cells have verified that their threshold voltages are at the final target voltage for that memory cell. If so, the programming process is completed successfully (status=pass) in step 826. If all or almost all of the memory cells are not verified to have reached their final target levels, then it is determined whether the program counter (PC) is less than a maximum value such as 20. If the program counter (PC) is not less than max (step 828), then the program process has failed (step 830). If the program counter (PC) is less than a maximum value (e.g., 20), then the program counter (PC) is incremented by one and the program voltage is stepped up to the next pulse in step 832. Subsequent to step 832, the process loops back to step 820 and the next program pulse is applied to the memory cells.

FIGS. 9(A)-9(H) are timing diagrams illustrating voltages during program operations, according to one embodiment. The timing diagram depicts one embodiment of programming conditions that are applied during step 820 of process 800. In various embodiments, one or more of the programming conditions depends on the location of the selected word line. In some embodiments, the magnitude of a voltage depends on the location of the selected word line. In one embodiment, the duration of the program voltage depends on the location of the selected word line.

The voltages shown are applied to various select lines, word lines, bit lines, and the common source line of the memory array, for NAND strings under fast programming, slow programming, and program inhibition. The program operation can be grouped into a Bit Lines Precharge Phase, a Program Phase and a Discharge Phase.

Bit Lines Precharge Phase: During phase (1), the SGS transistors 406 are turned off by SGS being at Vsgs (FIG. 9(A)) while the SGD transistors 424 are turned on by SGD going high to Vsg (FIG. 9(B)), thereby allowing a bit line to access a NAND string. In one embodiment, the magnitude of Vsgs depends on the location of the selected word line. In one embodiment, the magnitude of Vsgs is higher when lower word lines are being programmed to prevent or reduce GIDL. In one embodiment, the magnitude of Vsgs is negative when middle word lines or higher word lines are being programmed to prevent or reduce program disturb associated with DIBL.

During phase (2), the bit line voltage of a program-inhibited NAND string is allowed to rise to a predetermined voltage given by VBL_inhibit (FIG. 9(E)). When the bit line voltage of the program-inhibited NAND string rises to VBL_inhibit, the program-inhibited NAND string will float when the gate voltage on the SGD transistor 424 drops to V_SGD. In one embodiment, the voltage VBL_inhibit depends on which word line is selected for programming.

At the same time, the bit line voltage of a programming NAND string is either pulled down to VBL_Select or maintained at VBL_Select if already there (FIG. 9(G)). In one embodiment, the voltage VBL_Select depends on which word line is selected for programming.

Also during phase (2), the bit line voltage of NAND strings that are undergoing slow programming is set to an intermediate voltage given by VBL_QPW (FIG. 9(F)). The voltage VBL_QPW is between VBL_Select and VBL_inhibit. The voltage VBL_QPW allows the selected memory cell to program, but at a slower rate than if VBL_Select were used. In one embodiment, the voltage VBL_QPW depends on which word line is selected for programming.

Also during phase (2), the voltage on the common source line is set to voltage given by V_Cell_Source (FIG. 9(H)). In one embodiment, the voltage V_Cell_Source depends on which word line is selected for programming.

During phase (3), the drain select line (SGD) connecting to the SGD transistors 424 of NAND strings has its voltage lowered to V_SGD. In one embodiment, this will float only those program-inhibited NAND strings where their bit line voltage is comparable to V_SGD, since their SGD transistors 424 are turned off (FIGS. 9(B) & 9(E)). As for the NAND strings containing a memory cell to be programmed, their SGD transistors 424 will not be turned off relative to the bit line voltage (e.g., near 0V) at their drain. In one embodiment, the voltage V_SGD depends on which word line is selected for programming. In one embodiment, the voltage V_SGD depends on the location of the selected word line in order to prevent or eliminate effects of DIBL. For example, the SGD transistors 424 of unselected NAND strings may be kept off despite their Vth being lowered by DIBL. In one embodiment, the magnitude of V_SGD is lower for higher selected word lines, which may keep the SGD transistors 424 turned off despite possible DIBL.

In one embodiment, the magnitude of V_SGD depends on the location of the selected word line in order to prevent or eliminate effects of GIDL. For example, the magnitude of V_SGD may be higher when the selected word line is near the SGD transistors 424 (relative to when the selected word line is a middle word line, for example). This increase in V_SGD may prevent leakage of charge from the boosted channel due to GIDL.

During phase (4), the memory cells in a NAND string not being programmed have their control gate voltage set to VPASS (FIG. 9(C)). Also, the memory cell being programmed may have its control gate voltage set to VPASS (FIG. 9(D)). Since a program-inhibited NAND string is floating, the VPASS applied to the control gates of the memory cells boosts up the voltages of their channels. For the sake of discussion, the entire NAND string may be considered to have a channel. Thus, it may be stated that VPASS boosts the channel voltage of the NAND string. VPASS may be set to some intermediate voltage (e.g., ~10V) relative to Vpgm (e.g., ~15-24V). Depending on the boosting scheme being used, the value of VPASS is not required to be the same for each unselected word line.

Program Phase: During phase (5), a programming voltage Vpgm is applied to the control gate of a memory cell selected for programming (FIG. 9(D)). This may be achieved by applying Vpgm to the selected word line. The memory cells under program inhibition (e.g., with boosted channels) will not be programmed. The memory cells under programming will be programmed. Note that Vpgm may also contribute to channel boosting. Applying program conditions that depend on which word line is selected may prevent or substantially reduce the boosted channel voltage from reducing during the program phase.

In one embodiment, the duration of the program pulse (e.g., duration of phase 5) depends on the location of the selected word line. This may help to reduce or eliminate program disturb.

In the Discharge Phase: During phase (6), the various control lines and bit lines are allowed to discharge.

Any combination of the selected word line dependent signals discussed in connection with FIG. 9 may be used together when programming non-volatile storage.

Selected Word Line Dependent Programming Voltage Pulse Width

In one embodiment, the width (or duration) of a programming pulse depends on the location of the word line that is selected for programming. As one example, a shorter width may be used when programming edge word lines. Using a shorter width for the programming pulse for edge word lines may reduce program disturb on those word lines. If the programming pulse used for other word lines is too short, then a problem such as poor programming for the far end of the word line may occur.

Each word line does not necessarily have the same physical characteristics. For example, some word lines may be wider than others. As a specific example, edge word lines may be wider than other word lines. A possible reason for this is due to limitations of the lithography process used to form the word lines. There may also be differences in doping profiles used in the substrate near edge word lines compared to other word lines. Differences in physical characteristics (not necessarily those physical characteristics just mentioned) may result in different optimum widths for programming voltages.

Figure 10:
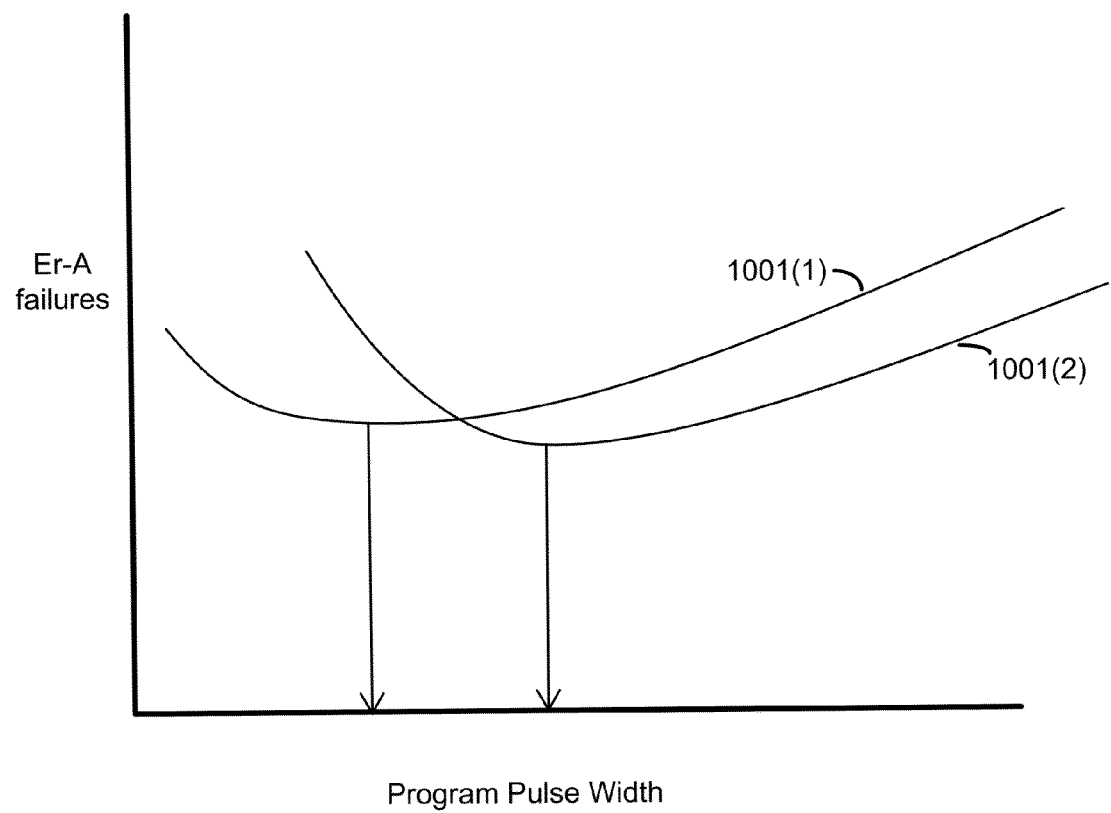
FIG. 10 is a graph that shows Erase-to-A failures versus program pulse width for selected word lines in various positions along a NAND string.

In one embodiment, the pulse width for each selected word line is such that Er-A failures are minimized, or at least close to the minimum. FIG. 10 is a graph that shows Er-to-A failures versus program pulse width for selected word lines in various positions along a NAND string. Referring to FIG. 10, for any given word line there may be an optimum program pulse width to reduce Er-A failures. Curve 1001(1) is for edge word lines, whereas curve 1001(2) is for middle word lines. As the programming pulse width is made shorter, the Er-A failures may be reduced up to a point. However, at some point, the Er-A failures may become greater as the program pulse width is further reduced. Also note that the optimum pulse width for edge word lines may be shorter than for middle word lines.

A possible reason for higher Er-A fails when the program pulse width is too short is that a higher magnitude of program voltage may be needed to complete the programming of the word line. Needing to use a higher magnitude program voltage can increase program disturb, which counters the beneficial effect of a shorter program pulse width.

In one embodiment, a program pulse width is determined for each word line position based on how many program loops it takes to complete programming each word line. This may help to reduce failures due to problems such as program disturb.

In one embodiment, the program pulse width depends on the selected word line. In one embodiment, the program pulse width depends on the width of the selected word line. In one embodiment, a shorter program pulse width is used for edge word lines. In one embodiment, a program pulse width is determined for each word line position based on the number of program loops it takes to complete programming each word line. Prior to discussing various program processes in which the program pulse width depends on the selected word line, some word line dependent characteristics will be discussed.

Figure 11A:
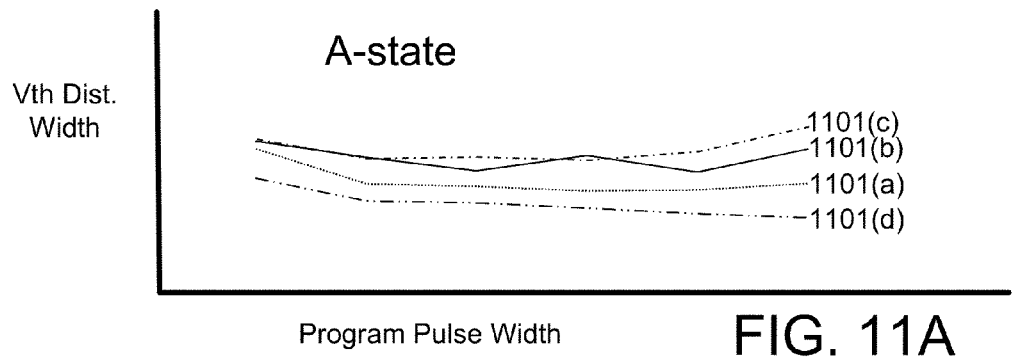
FIG. 11A, FIG. 11B, and FIG. 11C show example graphs of Vth distribution widths versus program pulse widths.
Figure 11B:
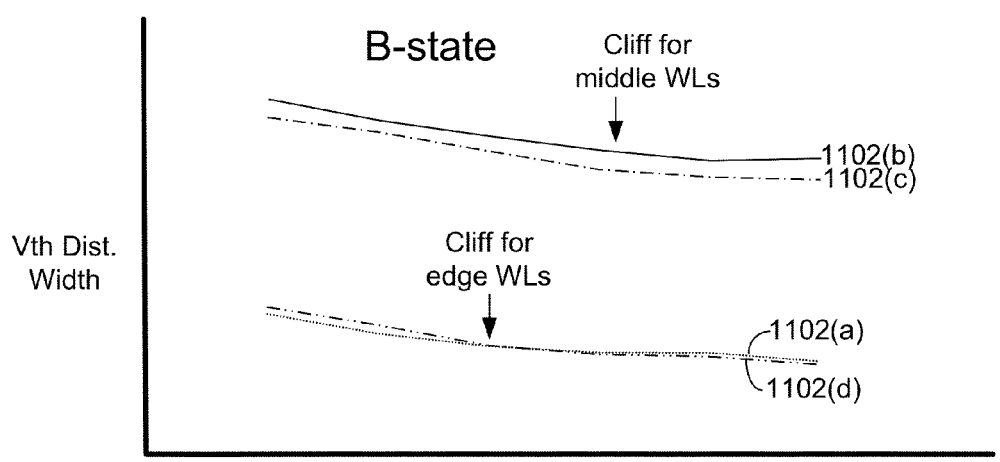
Figure 11C:
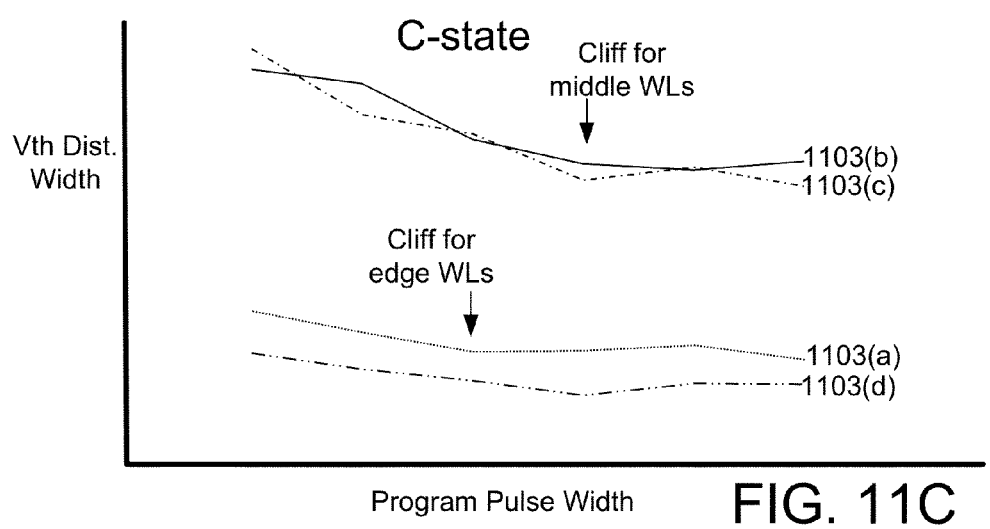

FIGS. 11A, 11B, and 11C show example graphs of Vth distribution widths versus program pulse widths. FIG. 11A is for the A-state, FIG. 11B is for the B-state, and FIG. 11C is for the C-state. Each graph shows two example curves for edge word lines and two examples for "middle word lines." In FIG. 11A, 1101(a) is for the lowest edge word line, 1101(b) and 1101(c) are middle word lines, 1101(d) is the highest edge word line. In FIG. 11B, 1102(a) is for the lowest edge word line, 1102(b) and 1102(c) are for middle word lines, 1102(d) is for the highest edge word line. In FIG. 11C, line 1103(a) is for the lowest edge word line, 1103(b) and 1103(c) are for middle word lines, 1103(d) is for the highest edge word line. The middle word lines may be about in the midpoint of the NAND string.

These graphs in FIGS. 11B and 11C show that the Vth distribution may become wider with shorter programming pulse width for all word lines, at least for the B- and C-states. The Vth distribution width for the A-state might not depend on program pulse width as heavily as it does for other data states, although for some devices and programming processes this may be a possibility.

Referring to FIGS. 11A-11C, the edge word lines may have a tighter Vth distribution for a given pulse width than the middle word lines. Also, the "cliff" may occur at a lower program pulse width for the edge word lines than for the middle word lines (see FIGS. 11B and 11C). The cliff refers to the point at which the Vth distribution widening begins to increase rapidly with shorter program pulse width. Since the cliff may be lower for the edge word lines (at least for some data states), the edge word lines may be more tolerant to shorter program pulse widths.

Figure 12:
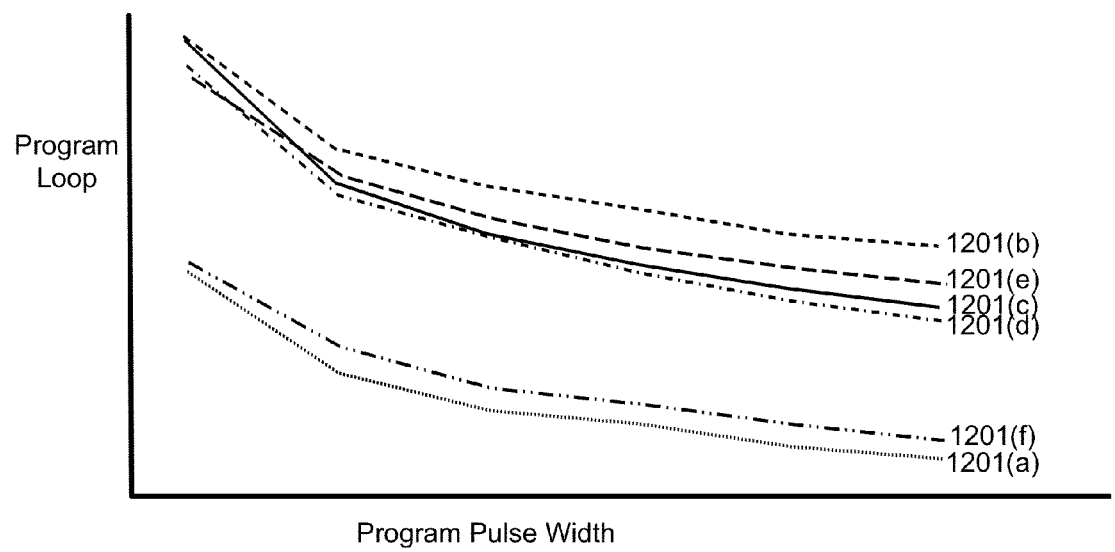
FIG. 12 shows a graph of program loop count versus program pulse width.

FIG. 12 shows a graph of program loop count versus program pulse width. The graph shows two curves for edge word lines (1201(a), 1201(f)) and four curves for middle word lines (1201(b), 1201(c), 1201(d), 1201(e)). These edge word lines may be WL0 and WL63, as one example. However, there may be more or fewer word lines. The middle word lines may be WL1, WL32, WL33, and WL62. Thus, in this example, there is one edge word line at each end of the NAND string. As noted earlier, in some contexts there may be more than one edge word line at each and of the NAND string. The number of program loops may increase with decreasing program pulse width. Note that the edge word lines may program faster than the middle word lines across all program pulse widths. In one embodiment, to achieve the same program loop (program performance) for edge WLs and middle WLs, a shorter program pulse width may be used on edge WLs.

Figure 13A:
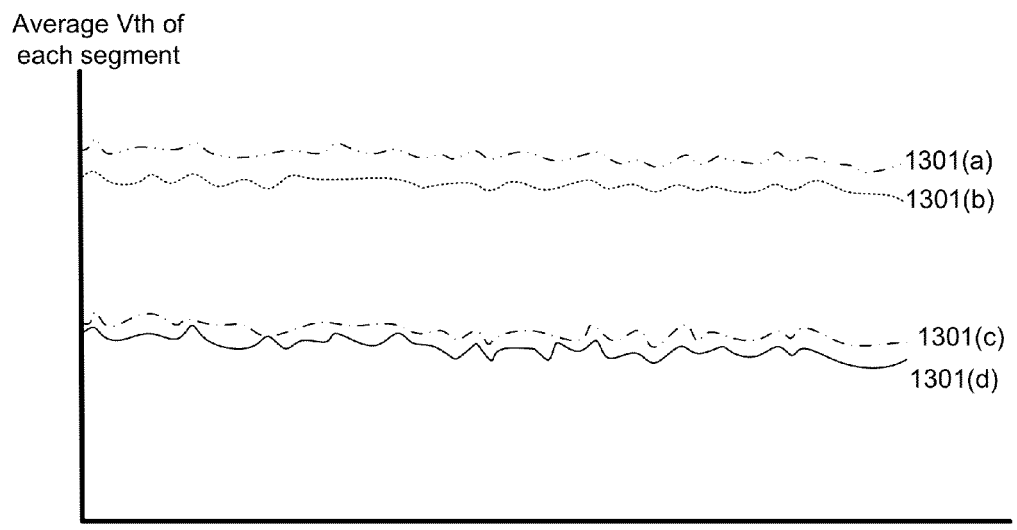
FIGS. 13A and 13B are graphs that show word lines RC dependence
Figure 13B:
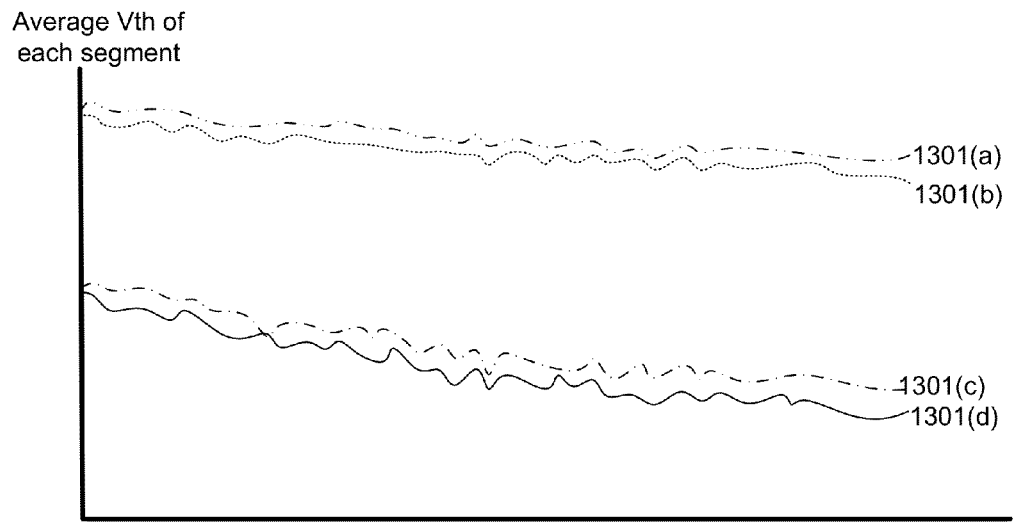

FIGS. 13A and 13B are graphs that show word lines RC dependence. FIG. 13A is for a relatively long program pulse width. FIG. 13B is for a relatively moderate program pulse width. Curves 1301(a) and 1301(b) are for edge word lines. Curves 1301(c) and 1301(d) are for middle word lines. Each curve 1301(a)-1301(d) shows the average Vth of memory cells at different points along the selected word line. In this example, each word line may be programmed pulse by pulse without verify. The memory cells may be grouped into segments, based on physical location. For example, memory cells may be grouped into 72 segments (segments 0-71) for purposes of analysis. The Vth for each memory cell in a given segment may be averaged to produce an average Vth for that segment. The Vth difference between segment 0 and segment 71 may be a measure of RC delay along the word line.

Note that when the program pulse width is shorter (FIG. 13B), the middle word lines 1301(c), 1301(d) show a significant drop in Vth for the higher segments. This may be due to significant RC delay when programming the middle word lines. However, the edge word lines 1301(a), 1301(b) do not show as much of a drop in Vth for higher segments. This may be due to there being less RC delay for edge word lines. Word line width may affect RC delay. As one example, edge word lines may be wider, thus having less RC delay. For some devices, even word lines and odd word lines have different widths. Therefore, even and odd word lines may have different RC delay.

Referring now to FIG. 13A, neither the edge 1301(a), 1301(b) nor the middle word lines 1301(c), 1301(d) show as much of a drop in Vth for the higher segments. As noted, the program pulse width is longer in this case. Therefore, the RC delay along the word line may not be as important since the pulse width is longer.

Characteristics of the lithographic process used to form the word lines may determine the width of word lines. For example, the intent may be to form all word lines with the same width, edge word lines may end up wider than middle word lines. A possible reason for this is that the edge word lines are near select lines, which may be intended to be significantly wider than word lines. For some lithographic processes when parallel lines are formed, the process may work best if the lines are of the same width. However, since an edge word line is located between relatively narrow middle word lines and a relatively wide selected line, the edge word line may end up larger than middle word lines.

In view of the difference in RC delay for different word lines, programming in accordance with one embodiment uses shorter program pulse widths for word lines having less RC delay. In one embodiment, edge word lines have less RC delay than middle word lines. For some devices, the word lines with less RC delay may be otherwise. One factor in having less RC delay may be the width of word lines. However, there may be other factors.

FIG. 14 is a flowchart of one embodiment of a process 1400 of programming non-volatile storage. In step 1402, a programming voltage is applied to a selected word line that has a duration that depends on the width of the selected word line. The duration of the program voltage may be defined as a program voltage pulse width. Process 1400 may be used to implement a portion of step 820 from FIG. 8. Specifically, applying a program voltage to a selected word line is one of the program conditions of step 820. Referring to FIG. 9(D), step 1402 is one embodiment of applying Vpgm during the program phase. Thus, the time duration of phase (5) depends on the selected word line, in one embodiment. Various other signals depicted in FIG. 9 may also be applied during process 1400. Zero or more of these signals may have its value depend on the selected word line.

Step 820 may be performed multiple times to program the selected word line. In one embodiment, the same program pulse width is used for each program loop when programming the selected word line. However, the program pulse width could be changed with the number of program loops.

In one embodiment, a shorter pulse width is used in step 1402 for wider word lines (and wider for more narrow word lines). In one embodiment, edge word lines are wider than middle word lines. Thus, a shorter program pulse width may be used for edge word lines than for middle word lines.

FIG. 15 is a flowchart of one embodiment of a process 1500 of programming non-volatile storage. Process 1500 describes programming a lowest word line, a middle word line, and a highest word line. By a lowest word line, it is meant the lowest word line for which user or system data is stored. There may also be one or more dummy word lines in between the lowest word line and the source side select line. Likewise, by a highest word line, it is meant the highest word line for which user or system data is stored. There may also be one or more dummy word lines in between the highest word line and the drain side select line. The lowest and highest word lines may be referred to as "edge" word lines. For memory devices in which the edge word lines are wider than the middle word lines, process 1500 is one implementation of step 1402 from process 1400.

Process 1500 describes programming signals that are applied to three different word lines for the same point in the programming process when different word lines are selected for programming. As noted, the programming process has a number of program loops (or steps). By the same point it is meant the loop (or program step). This could be the initial program loop or some other program loop.

In step 1502, a programming signal having a first pulse width is applied to a lowest word line. Referring to FIG. 2, this may be applied to WL0. Referring to FIG. 3, this may be applied to WL0. Referring to FIG. 5A, this may be applied to WL0. Step 1502 is one embodiment of step 820 from process 800. In one embodiment, step 1502 is for the first program pulse that is applied to the lowest word line (e.g., first iteration of process 800). Referring to FIG. 9(D), step 1502 is one embodiment of applying Vpgm during the program phase.

There is a dashed line between step 1502 and 1504 to indicate that other programming signals may be applied to the lowest word line to complete its programming before proceeding on to program the middle word line. In step 1504, a programming signal having a second pulse width is applied to a middle word line. In one embodiment, the programming signal is applied to any word line between the lowest and highest word lines. However, there may be more than one edge word line at each end of the string of memory cells (e.g., NAND string). For example, there might be two or three edge word lines at each end. Thus, the middle word line is not necessarily any word line between the lowest and highest word lines. The second pulse width is longer than the first pulse width. In one embodiment, step 1504 is for the first program pulse that is applied to the middle word line (e.g., first iteration of process 800). Referring to FIG. 9(D), step 1504 is one embodiment of applying Vpgm during the program phase.

In step 1506, a programming signal having a third pulse width is applied to a "highest" word line. Again, the dashed line between steps 1504 and 1506 indicates that other programming signals may be applied to the middle word line to complete its programming prior to going on to program the highest word line. Also, note that numerous middle word lines may be programmed. The highest word line may be the word line that is closest to the SGD transistor 424, and that is used to store user or system data. Referring to FIG. 2, this may be applied to WL3. Referring to FIG. 3, this may be applied to WL7. Referring to FIG. 5A, this may be applied to WL63. The third pulse width is shorter than the second pulse width. The third pulse width may be the same, shorter than, or longer than the first pulse width. In one embodiment, step 1306 is for the first program pulse that is applied to the highest word line (e.g., first iteration of process 800). Referring to FIG. 9(D), step 1506 is one embodiment of applying Vpgm during the program phase. Various other signals depicted in FIG. 9 may also be applied during process 1500. Zero or more of these signals may have its value depend on the selected word line.

Thus, in one embodiment, process 1500 includes applying a programming signal for a given program loop having a shorter pulse width when either the lowest word line or the highest word line is selected for programming than the pulse width used to program at least one other word line of the plurality of word lines.

For some devices, the lowest word line and the highest word line may be wider than middle word lines. In this case, process 1500 may be used to implement step 1402. In other words, process 1500 may result in applying a program voltage whose duration depends on the width of the selected word line. One possible reason for the edge word lines being wider than others is due to the lithographic process used to form the word lines. For some devices, the select lines (e.g., SGD and SGS in FIG. 5A) are wider than the word lines. For some lithographic processes, this may result in edge word lines printing somewhat wider than other word lines. Note that for other lithographic processes other word lines could be wider.

FIG. 16 is a flowchart of one embodiment of a process 1600 of programming non-volatile storage that involves determining a width of a program pulse. Referring to FIG. 9, process 1600 may be used to determine the time duration of the program phase.

Figure 17:
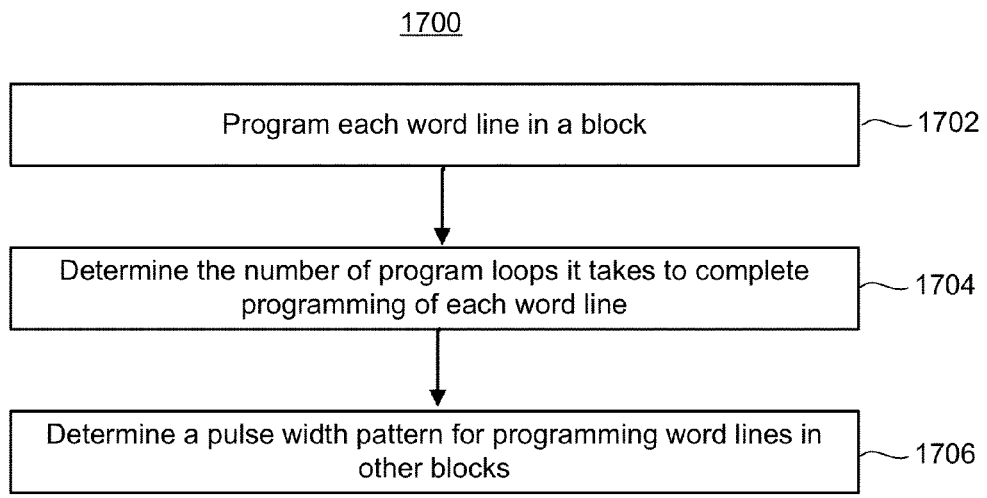
FIG. 17 is a flowchart of a process of determining suitable pulse widths for programming signals for word lines, depending on their position.

In step 1602, a width of a program pulse for the selected word line is determined. In one embodiment, this determination is made by accessing a table. FIG. 17 shows details of one embodiment of a process 1700 for determining a width for a particular word line. Process 1700 may be used to create the table accessed in step 1602.

In step 1604, a programming signal with the width (or time duration) determined in step 1602 is applied to the selected word line. Step 1604 may be repeated until all memory cells on the selected word line are programmed. Various other signals depicted in FIG. 9 may also be applied during process 1600. Zero or more of these signals may have its value depend on the selected word line.

If there are more word lines to program, then process 1600 returns to step 1402. In one embodiment, word lines in a block are programming sequentially from lowest to highest. However, word lines may be programmed in any order.

FIG. 17 is a flowchart of a process 1700 of determining suitable pulse widths for programming signals for word lines, depending on their position. The process 1700 may be performed on a sample block, with the results being used to program other blocks. The sample block may be in the same storage device as the other blocks, but this is not required. Some storage devices have more than one memory die. In this case, the sample block may be on the same memory die or another memory die.

In step 1702, each word line in the sample block is programmed. A process such as the one in FIG. 8 may be used to program each word line. In one embodiment, the starting voltage (Vpgm) may be the same for each word line. As one example, for the first program loop, the pulse 752 depicted in FIG. 7B may be applied separately to each word lines when it is the word line selected for programming. For the second program loop, the pulse 754 may be applied. Pulse 756 may be applied for the third loop, pulse 758 for the fourth loop. For additional loops, the pulse magnitude may be increased further. This allows for each word line to receive the same programming voltage (magnitude and duration) for each program loop. Note that the same pulse width may be used such that each word line receives similar programming voltages. Also note that it is not required to use the sequence of pulses as depicted in FIG. 7B. For example, the voltage magnitude is not required to increase with each program loop.

In step 1704, the number of program loops that it took to complete programming each word line is determined. Referring back to FIG. 8, recall that the program voltage may be incremented with each loop (although increasing Vpgm each loop is not required). Thus, one alternative is to determine the final program voltage for each word line. Stated another way, for some programming processes, determining the final program voltage may be the equivalent of determining the number of program loops.

In step 1706, a pulse width pattern for programming word lines in other blocks is determined. By a pulse width pattern it is meant a pulse width for a word line selected for programming at each position. For example, a table may be constructed with an entry for each word line and a suitable pulse width. However, it is not required that the table has a unique entry for each word line. In one embodiment, word lines are grouped into zones, with each word line in the zone having the same pulse width. These zones may be physically contiguous word lines. Any number of zones may be used. One zone may have a different number of word lines than another zone. In one embodiment, the table has a zone for edge word lines and a zone for all middle word lines. In one embodiment, the table has one zone for edge word lines near the SGS transistor 406 and one zone for edge word lines near the SGD transistor 424 (and one or more zones for middle word lines). In one embodiment, the table formed is process 1700 is used in step 1602 of FIG. 16.

Selected Word Line Dependent Select Gate Diffusion Region Voltage

Figure 18A:
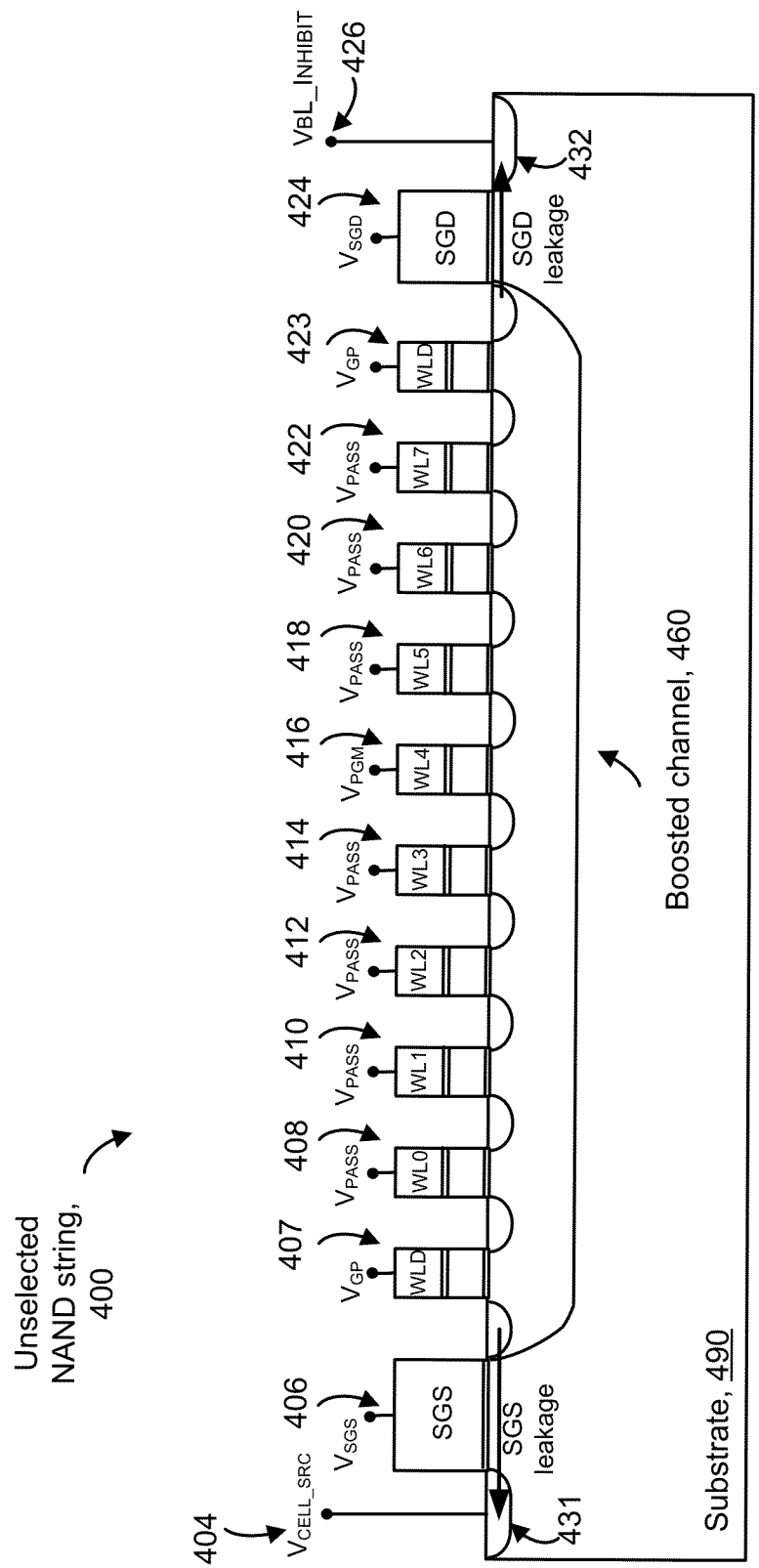
FIG. 18A shows a boosted NAND string having SGS leakage current and SGD leakage current.

One problem that may occur when programming NAND strings is leakage of current from a boosted channel. This current leakage can reduce the boosted channel potential of inhibited NAND strings. Therefore, program disturb may occur. FIG. 18A shows a NAND string that is inhibited from programming. A voltage V_BL_Inhibit is applied to the bit line contact 426. A boosting voltage Vpass is applied to control gates of unselected memory cells. A program voltage Vpgm is applied to the control gate of the selected memory cell. $V_{SGS}$ and $V_{SGD}$ are applied to the SGS transistor 406 and the SGD transistor 424, respectively. In this example, a voltage Vgp is applied to gates of dummy memory cells. This voltage may help to reduce GIDL. Note that neither the dummy memory cells, nor applying Vgp to the dummy memory cells is a requirement. However, even if a voltage Vgp is applied to the dummy memory cells, there still may be GIDL, as discussed below.

FIG. 18A shows a boosted NAND string having SGS leakage current and SGD leakage current. FIG. 18A shows an SGS leakage current that may occur across the channel of the SGS transistor 406, and an SGD leakage current that may occur across the channel of the SGD transistor 424. This leakage current may be due, at least in part, to punch-through conduction. One factor in this leakage current is the magnitude of the boosted channel potential relative to the source 431 or drain 432 of the select transistors 406, 424. For example, for SGS transistor 406, the boosted channel potential may be a higher voltage than the voltage applied to the source line contact 404. Also, the boosted channel potential may be higher than the bit line voltage, Vbl_inhibit, that is applied to bit line contact 426.

Another possible factor in current leakage is the channel length of the SGS and SGD transistors 406, 424. As memory devices continue to scale down, it is desirable to reduce the length of the gate of the SGS and SGD transistors 406, 424. However, reducing the length of the gate can increase the leakage current for inhibited NAND strings during programming. As noted, one factor in the increased leakage current may be punch-through conduction.

In one embodiment, the magnitude of the voltage that is applied to a terminal of an SGS or SGD select transistor 406, 424 of a NAND string depends on the location of the word line that is selected for programming. In one embodiment, the terminal is either a source 431 or a drain 432. In one embodiment, the magnitude of the voltage applied to the bit line depends on the location of the word line selected for programming. The bit line may be in electrical contact with the drain 432 of an SGD transistor 424. In one embodiment, the magnitude of the voltage applied to the common source line depends on the location of the word line selected for programming. The common source line may be in electrical contact with the sources 431 of SGS transistors 406 of NAND strings.

Applying a selected word line dependent voltage to a source 431 or drain 432 of, respectively, an SGS or SGD select transistor 406, 424 may reduce or eliminate punch-through current leakage. For example, this may eliminate current from leaking from a boosted channel of a NAND string across the channel of an SGS or SGD select transistor 406, 424 at the end of the NAND string. Reducing or eliminating the punch-through leakage helps to keep the channel potential boosted. Therefore, program disturb may be reduced or eliminated.

Figure 19:
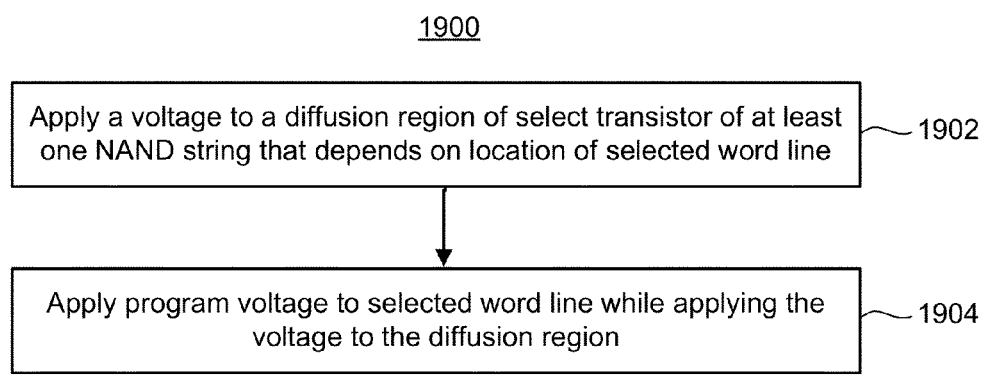
FIG. 19 is a flowchart of one embodiment of programming non-volatile storage that may counteract punch-through leakage.

FIG. 19 is a flowchart of a process 1900 of one embodiment of programming non-volatile storage that may counteract punch-through leakage. In process 1900 the magnitude of the voltage that is applied to a diffusion region 431, 432 of at least one of the select transistors 406, 424, depends on the location of the selected word line. Process 1900 may reduce or eliminate punch-through conduction, which may reduce or eliminate program disturb. Process 1900 may be used to program memory cells of NAND strings each having a first select transistor at a first end and a second select transistor at a second end. Process 1900 is one embodiment of applying program conditions as indicated in step 820 of process 800.

In step 1902, voltage is applied to a diffusion region 431, 432 of a select transistor 406, 424 of at least one of the NAND strings. Note that the diffusion region 431, 432 is on the opposite of the select transistor 406, 406 as the NAND string channel. The magnitude of the voltage applied to the diffusion region 431, 432 depends on the location of a selected word line on the NAND strings. In one embodiment, the voltage is applied to a contact to a NAND string. The contact may be a bitline contact 426 or a source line contact 404. When applied to a bitline, the voltage is applied to bitlines associated with NAND strings that are not selected for programming, in one embodiment. In one embodiment, the voltage is first applied during a bit line pre-charge and boosting phase (see FIG. 9). In one embodiment, the voltage continues to be applied during a program phase.

In one embodiment, the voltage is applied to the bit line (or bit line contact 426) associated with inhibited (or unselected) NAND strings. Stated another way, the voltage is applied to the (drain) diffusion region 432 of SGD transistors 424 of inhibited NAND string. Referring to FIG. 9(E), the value of VBL_inhibit is selected based on which word line is being programmed, in one embodiment of step 1902.

In one embodiment of step 1902, the voltage is applied to the (source) diffusion region 431 of an SGS transistor 406. In one embodiment, the voltage is applied to the common source line (or source contact 404) associated with the NAND strings. Referring to FIG. 9(H), the value of Vcell_src is selected based on which word line is being programmed, in one embodiment of step 1902.

In step 1904, a program voltage is applied to the selected word line while applying the voltage to the diffusion region of the select transistor 406, 424. Referring to FIG. 9(D), Vpgm may be applied to the selected word line during the program phase.

Figure 20A:
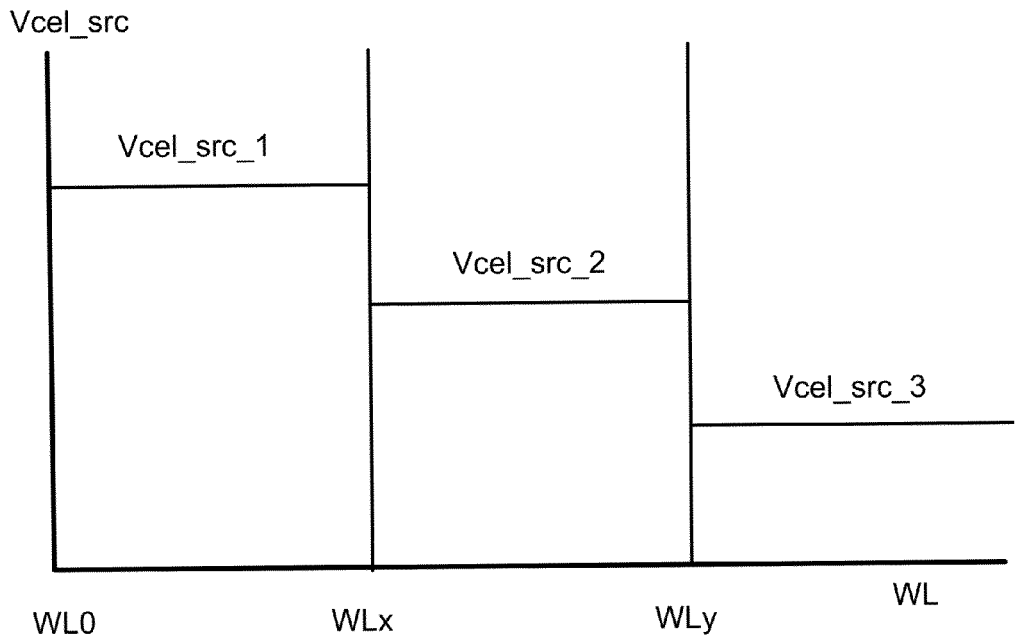
FIG. 20A shows relative values for Vcel_src versus word lines in accordance with one embodiment.

FIG. 20A shows relative values for Vcel_src versus word lines in accordance with one embodiment. As noted, Vcel_src may be applied to the common source line during a program operation (see FIG. 9(H), for example). In this embodiment, word lines are divided into three zones. In general, there may be two or more zones. In this embodiment, Vcel_src has the highest magnitude for the lowest word lines (e.g., WL0 to WLx-1). There may be one or more word lines in this first zone. In this embodiment, Vcel_src has a medium magnitude for the middle word lines (e.g., WLx to WLy-1). There may be one or more word lines in this second zone. In this embodiment, Vcel_src has the lowest magnitude for the highest word lines (e.g., WLy to the highest WL). There may be one or more word lines in this third zone.

Referring again to FIG. 18A, using a higher voltage for Vcel_src for the lowest word lines may reduce SGS leakage current. Recall that FIG. 18A is for an inhibited NAND string with a boosted channel. Typically, Vcel_src is lower in magnitude than the channel potential of a boosted NAND string. Therefore, there may be a significant voltage from NAND channel to the diffusion region 431 of the SGS transistor 406. Thus, there may be a significant voltage across the channel of the SGS transistor 406. Stated another way, there is a significant Vds voltage for the SGS transistor 406. Consequently, there may be a significant E-field across the channel of the SGS transistor 406.

Increasing the magnitude of Vcel_src reduces this Vds voltage for the SGS transistor 406. In other words, the E-field across the SGS transistor 406 may be reduced. Consequently, the SGS leakage current may be reduced. In turn, this means that the channel boosting may be improved. For example, the voltage of the boosted channel may be better maintained because the SGS leakage current may be reduced. Therefore, program disturb may be reduced or eliminated.

However, increasing the magnitude of Vcel_src may itself cause problems. One possible problem is the risk of junction stress for the source line contact which may cause undesired junction leakage. Another undesired leakage path may occur during programming. NAND strings that have a memory cell currently being programmed may have a channel voltage of about 0V, or some other voltage that is significantly lower than the boosted channel voltage of inhibited NAND strings. If the value of Vcel_src is allowed to go too high, then there could possibly be some current leakage from the common source line into the channels of NAND strings undergoing programming. This current leakage could be significant and may lead to undesirable power consumption.

Another factor to consider is that the magnitude of the boosted channel voltage may depend on which word line is being programmed. For example, the channel may boost to a higher potential when lower word lines are selected. In one embodiment, word lines are programmed in general from lowest word line to highest (note that it is not required to strictly follow this sequence). Thus, when the lower word lines are being programmed, drain side memory cells are still in the erase state. A memory cell that is erased may be more effective at boosting the channel voltage than a memory cell that is programmed to a higher data state.

Thus, when the lowest word lines are being programmed, the channel might boost to a higher voltage. This higher channel voltage could result in punch through conduction of the SGS transistor 406, if the value of Vcel_src were not increased. However, the embodiment depicted in FIG. 20A uses a higher Vcel_src when programming lower word lines. Therefore, SGS leakage current may be reduced or eliminated.

However, the embodiment depicted in FIG. 20A uses a lower Vcel_src when programming the highest word lines. For some boosting schemes, the channel voltage might not be that high (at least at the source end) when programming the highest word lines. Therefore, the value of Vcel_src may not need to be raised for this case to prevent punch through conduction at the SGS transistor 406. By not using a higher Vcel_src, the risk of current leaking from the common source line to the channels of selected NAND strings may be avoided.

The embodiment depicted in FIG. 20A also shows a middle zone for word lines in the middle. There may be word lines in the middle for which the amount of channel boosting (at least at the source end) is not quite as high as the case for the lowest word lines, but high enough such that SGS leakage current is a significant problem. For these middle word lines, using the middle value for Vcel_src may reduce or eliminate SGS leakage current, while putting less stress on the source contact junction. Thus, less (or no) current leaks from the common source line to the channels of selected NAND strings.

As noted above, there may be any number of zones of different values for Vcel_src. In one embodiment, the value of Vcel_src decreases for zones having higher word lines.

Figure 20B:
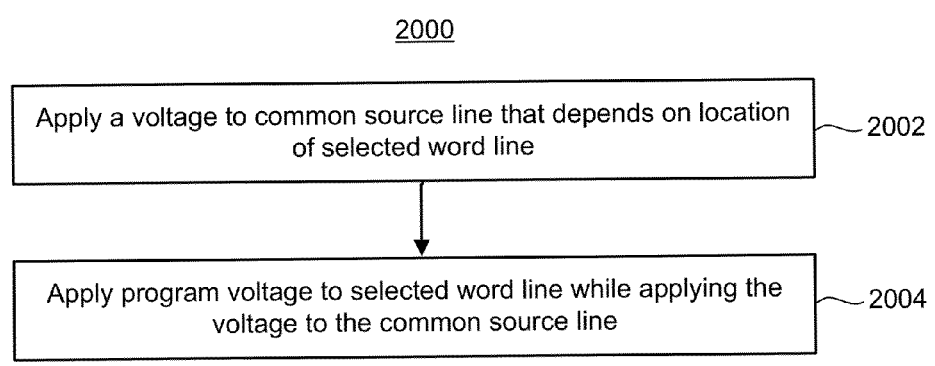
FIG. 20B depicts a flowchart of one embodiment of a process of programming non-volatile storage in which the voltage applied to the common source line depends on the location of the selected word line.

FIG. 20B depicts a flowchart of one embodiment of a process 2000 of programming non-volatile storage. Process 2000 is one embodiment of process 1900. In step 2002, a voltage that depends on the location of the word line that is selected for programming is applied to the common source line. Referring to FIG. 9(H), the value of Vcell_src is selected based on the location of the word line being programmed, in one embodiment.

In one embodiment, step 2002 includes applying a first voltage to a source line contact 404 if the selected word line is in a first group of one or more word lines, and applying a second voltage to the source line contact 404 if the selected word line is in a second group of the word lines. Referring to FIG. 20A, the first group of word lines (e.g., WL0 to WLx-1) is closer to the SGS transistor 406 than the second group of word lines (e.g., WLx to WLy-1 or WLy to the highest word line), in one embodiment. The first voltage (e.g., Vcel_src 1) is greater than the second voltage (e.g., Vcel_src_2 or Vcel_src 3), in one embodiment.

In step 2004, a program voltage is applied to the selected word line while applying the voltage to the common source line. Referring to FIG. 9(D), the voltage Vpgm may be applied to the select word line during the program phase. Various other signals depicted in FIG. 9 may also be applied during process 2000. Zero or more of these signals may have its value depend on the location of the selected word line.

Figure 21A:
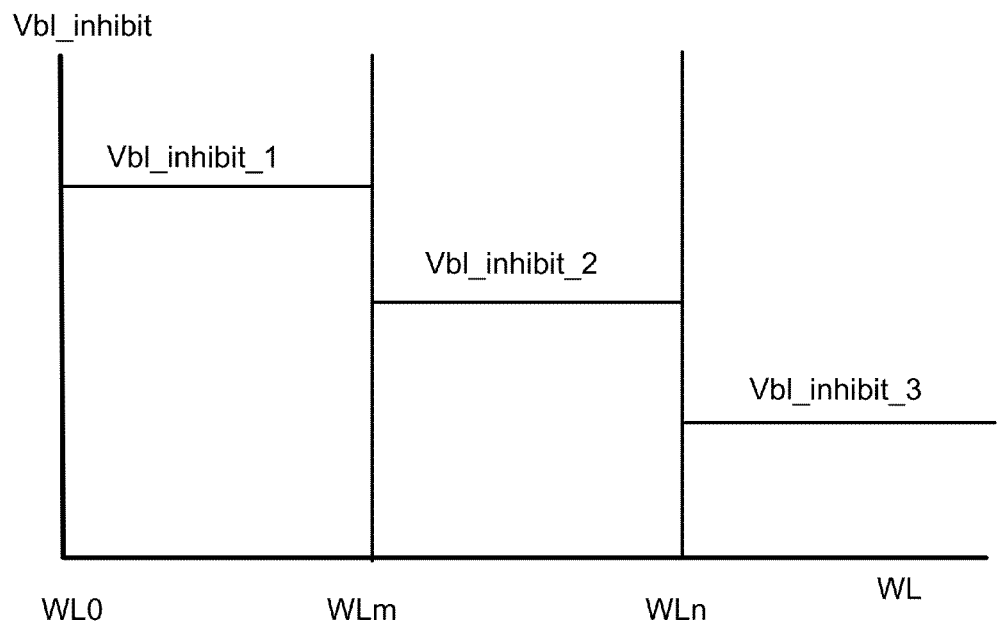
FIG. 21A shows inhibited bit line voltage versus word line for one embodiment.

In one embodiment, the voltage applied to bit lines associated with NAND strings that are not selected for programming depends on the location of the selected word line. FIG. 21A shows relative values for Vbl_inhibit versus word lines in accordance with one embodiment. Vbl_inhibit may be applied to the bit line of unselected NAND strings during a program operation (see FIG. 9(E), for example). In this embodiment, word lines are divided into three zones. In general, there may be two or more zones. In this embodiment, Vbl_inhibit has the highest magnitude for the lowest word lines (e.g., WL0 to WLm-1). There may be one or more word lines in this first zone. In this embodiment, Vbl_inhibit has a medium magnitude for the middle word lines (e.g., WLm to WLn-1). There may be one or more word lines in this second zone. In this embodiment, Vbl_inhibit has the lowest magnitude for the highest word lines (e.g., WLn to the highest WL). There may be one or more word lines in this third zone.

Referring again to FIG. 18A, typically, Vbl_inhibit is lower in magnitude than the channel potential of a boosted NAND string. Therefore, there may be a significant voltage across the channel of the SGD transistor 424. Stated another way, there may be a significant voltage between the NAND channel near the SGD transistor 424 and the diffusion region 432. Therefore, there is a significant Vds for the SGD transistor 424. Note that since the boosted NAND channel voltage may be greater than Vbl_inhibit, the diffusion region 432 could be considered to be the source side of the SGD transistor 424 in this context. As a result of the Vds, may be a significant E-field across the channel of the SGD transistor 424. This E-field may lead to SGD leakage current from the NAND channel to the diffusion region 432.

Increasing the magnitude of Vbl_inhibit may reduce Vds of the SGD transistor 424. In other words, the E-field across the channel of the SGD transistor 424 may be reduced. Consequently, the SGD leakage current may be reduced. In turn, this means that the channel boosting may be improved. For example, the voltage of the boosted channel may be better maintained because the SGD leakage current may be reduced. Therefore, program disturb may be reduced or eliminated.

However, increasing the magnitude of Vbl_inhibit may itself cause problems. One possible problem is the risk of junction stress for the bit line contact 426 which may cause increased junction leakage. Another undesired effect of using a higher Vbl_inhibit is increased power consumption during the precharging of the bitlines at the beginning of the programming. As the bitline-to-bitline capacitance is not negligible, a significant amount of power may be consumed during precharging; therefore, as low as possible Vbl_inhibit may be desired.

As previously discussed, when the lowest word lines are being programmed, the channel might boost to a higher voltage. This higher channel voltage could result in SGD leakage, if the value of Vbl_inhibit were low enough to allow punch through conduction. However, the embodiment depicted in FIG. 21A uses a higher Vbl_inhibit for the lower word lines. Therefore, SGD leakage may be reduced. Note that if punch through conduction is a problem with middle or upper word lines, then a higher Vbl_inhibit could be used when those word lines are programmed.

On the other hand, the embodiment depicted in FIG. 21A uses a lower Vbl_inhibit for the highest word lines. For some boosting schemes, the channel voltage might not be that high (at least at the drain end) when programming the highest word lines. Therefore, the value of Vbl_inhibit does not need to be raised for this case to avoid punch through conduction.

The embodiment depicted in FIG. 21A also shows a middle zone for word lines in the middle. There may be word lines in the middle for which the amount of channel boosting (at least at the drain end) is not quite as high as the case for the lowest word lines, but high enough such that SGD leakage is a significant problem. For these middle word lines, using the middle value for Vbl_inhibit reduces or eliminated SGD leakage, while putting less stress on the bit line contact junction and also reducing power consumption during precharging.

As noted above, there may be any number of zones of different values for Vbl_inhibit. In one embodiment, the value of Vbl_inhibit decreases for zones having higher word lines.

Figure 21B:
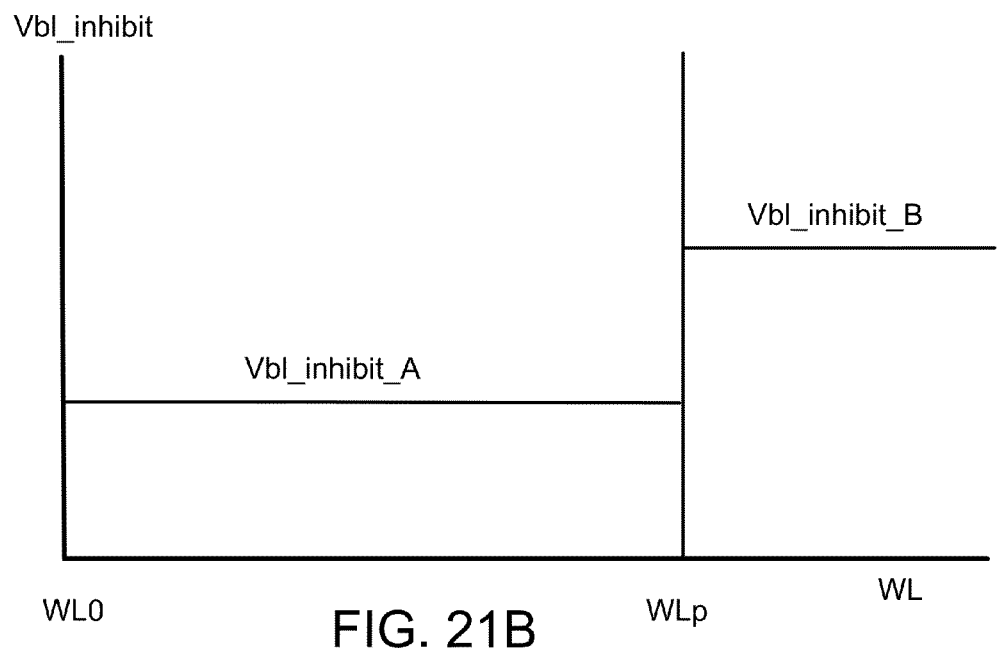
FIG. 21B shows inhibited bit line voltage versus word line for one embodiment.
Figure 21C:
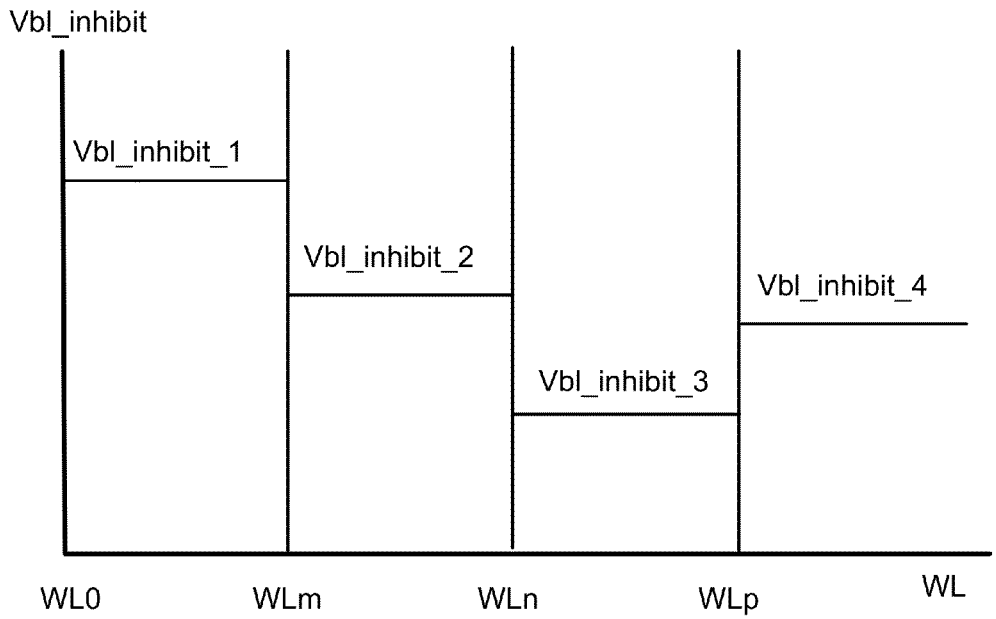
FIG. 21C shows inhibited bit line voltage versus word line for one embodiment.

FIG. 21B shows relative values for Vbl_inhibit versus word lines in accordance with one embodiment. Vbl_inhibit may be applied to the bit line of unselected NAND strings during a program operation (see FIG. 9(E), for example). In this embodiment, word lines are divided into two zones. In general, there may be two or more zones. In this embodiment, Vbl_inhibit has the highest magnitude (Vbl_inhibit_B) for the highest word lines (e.g., WLp to the highest word line). There may be one or more word lines in this zone. In this embodiment, Vbl_inhibit has lower magnitude (Vbl_inhibit_A) for at least some of the word lines below this. In this example, all word lines between WL0 and WLp-1 have the voltage (Vbl_inhibit_A). However, a scheme such as depicted in FIG. 21A might be used for these lower word lines. FIG. 21C shows one such example.

Figure 21D:
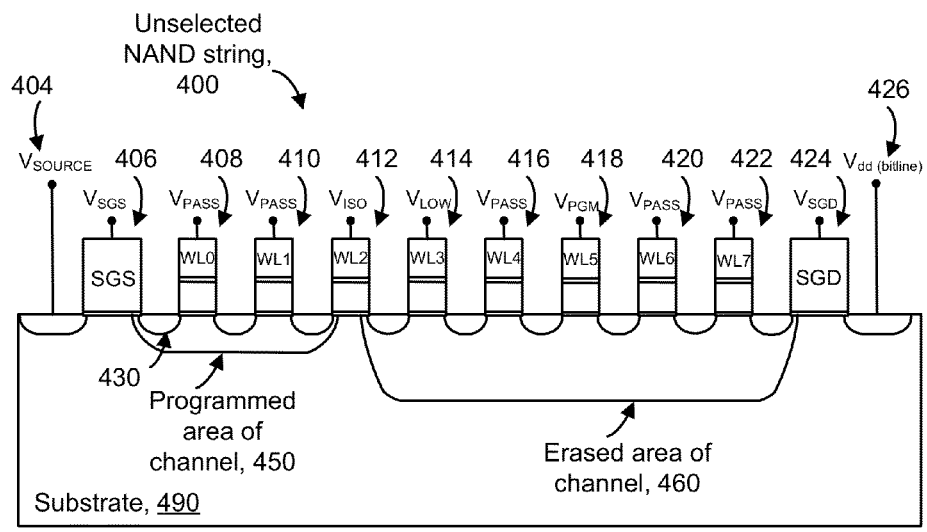
FIG. 21D shows an inhibited NAND string with a boosting scheme referred to as Erase Area Self Boosting (EASB).

FIG. 21D shows an inhibited NAND string with a boosting scheme referred to as Erase Area Self Boosting (EASB). FIG. 21D depicts a cross-sectional view of an unselected NAND string showing programmed and erased areas with erased area self-boosting (EASB). The view is simplified and not to scale. During programming, $V_{PGM}$ is provided on a selected word line, in this case, WL5, which is associated with a selected storage element 418.

In one example boosting scheme, when storage element 418 is the selected storage element, a relatively low voltage, $V_{LOW}$, e.g., 4 V, is applied to a neighboring source-side word line (WL3), while an isolation voltage, $V_{ISO}$, e.g., 0-2.5 V, is applied to another source-side word line (WL2), referred to as an isolation word line and $V_{PASS}$ is applied to the remaining word lines associated with NAND string 400 (i.e., WL0, WL1, WL4, WL6 and WL7). $V_{SGS}$ is applied to the select gate 406 and $V_{SGD}$ is applied to the select gate 424.

Assuming programming of storage elements along the NAND string 400 progresses from storage element 408 to storage element 422, when storage elements associated with WL5 in other NAND strings are being programmed, storage elements 408-416 will already have been programmed, and storage elements 420 and 422 will not yet have been programmed. Note that storage element 418 is not programmed when the NAND string 400 is inhibited, in this example, even though a program voltage is applied on WL5. Thus, all or some of storage elements 408-416 will have electrons programmed into and stored in their respective floating gates, and storage elements 420 and 422 can be erased or partially programmed, depending on the programming mode. For example, the storage elements 420 and 422 may be partially programmed when they have been previously programmed in the first step of a two-step programming technique.

With the EASB boosting mode, $V_{ISO}$ is applied to one or more source-side neighbors of the selected word line and is sufficiently low to isolate programmed and erased channel areas in the substrate, at some point after boosting is initiated. That is, a channel area 450 of the substrate on a source-side of the unselected NAND string 400 is isolated from a channel area 460 on a drain-side of the unselected NAND string 400. The source side can also be considered to be a programmed side since most or all of the associated storage elements have been programmed, while the drain side can also be considered to be an unprogrammed side since the associated storage elements have not yet been programmed. Further, the channel area 450 is a first boosted region of the substrate 490 which is boosted by the application of $V_{PASS}$ on WL0 and WL1, while the channel area 460 is a second boosted region of the substrate 490 which is boosted mainly by the application of $V_{PGM}$ on WL5 and $V_{PASS}$ on WL4, WL6 and WL7. Since $V_{PGM}$ dominates and also because precharging is more efficient for erased memory cells, the erased area 460 will experience relatively higher boosting than the programmed area 450. Moreover, the channel boosting may be provided for a time period before $V_{PGM}$ is applied, at which time the channel areas 450 and 460 are similarly boosted.

As programming progresses to the highest word lines, the erased area of the channel 460 will consist of fewer memory cells having Vpass applied to their gates. However, there will always be one with Vpgm applied. Since Vpgm is a higher voltage than Vpass, the average voltage applied to the gates of memory cells in the erased area may increase as higher word lines are programmed. This may increase the boosted channel potential. It is possible that the channel can boost up to a sufficiently high voltage such that punch through conduction occurs (e.g., SGD leakage).

Referring again to FIG. 21B, in one embodiment, the bit line voltage for inhibited NAND strings is increased with higher word lines. This may prevent or reduce punch through conduction. This may be used when EASB is used, but may also be used for other boosting modes.

Figure 21E:
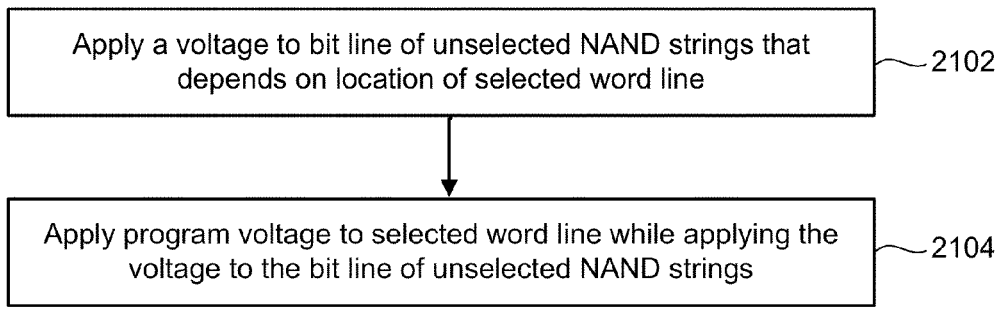
FIG. 21E depicts a flowchart of one embodiment of a process of programming non-volatile storage in which a bit line voltage depends on the selected word line.

FIG. 21E depicts a flowchart of one embodiment of a process 2100 of programming non-volatile storage in which a bit line voltage depends on the selected word line. Process 2100 is one embodiment of process 1900. In step 2102, a voltage is applied to bit lines of unselected NAND strings. The voltage depends on the location of the word line that is selected for programming. Referring to FIG. 9(E), the voltage VBL_inhibit may be applied. In one embodiment, this is first applied during a bit line pre-charge and boosting phase. The voltage may be maintained during a program phase.

In one embodiment, step 2102 includes applying a first voltage to a bit line contact 426 if the selected word line is in a first group of one or more word lines, and applying a second voltage to the bit line contact 426 if the selected word line is in a second group of the word lines. Referring to FIG. 21A, the first group of word lines (e.g., WL0-WLm-1)) is closer to the SGS transistor 406 than the second group of word lines (e.g., WLm to WLn-1 or WLn to the highest word line), in one embodiment. The first voltage (e.g., Vbl_inhibit_1) is greater than the second voltage (e.g., Vbl_inhibit_2 or Vbl_inhibit_3), in one embodiment.

In one embodiment, step 2102 includes applying a first voltage to bit lines of unselected NAND strings if the selected word line is in a first group of one or more word lines, and applying a second voltage to the bit lines of the unselected NAND strings if the selected word line is in a second group of one or more word lines. In this embodiment, the first group is closer to the SGD transistor 424, and the first voltage is greater in magnitude than the second voltage. Referring to FIG. 21B, the first group of word lines (e.g., WLp to the highest word line) is closer to the drain select transistor 424 than the second group of word lines (e.g., WL0 to WLp-1), in one embodiment. The first voltage (e.g., Vbl_inhibit_B) is greater than the second voltage (e.g., Vbl_inhibit_A), in one embodiment.

In step 2104, a program voltage is applied to the selected word line while applying the voltage to the bit lines of unselected NAND strings. Referring to FIG. 9(D), the voltage Vpgm may be applied.

Various other signals depicted in FIG. 9 may also be applied during process 2100. Zero or more of these signals may have its value depend on the selected word line. In one embodiment, step 2102 of process 2100 is performed together with step 2002 of process 2000. Thus, the magnitude of the voltage applied to both the common source line and the bit lines associated with unselected NAND strings depend on the location of the word line selected for programming, in one embodiment.

GIDL Protect

Figure 18B:
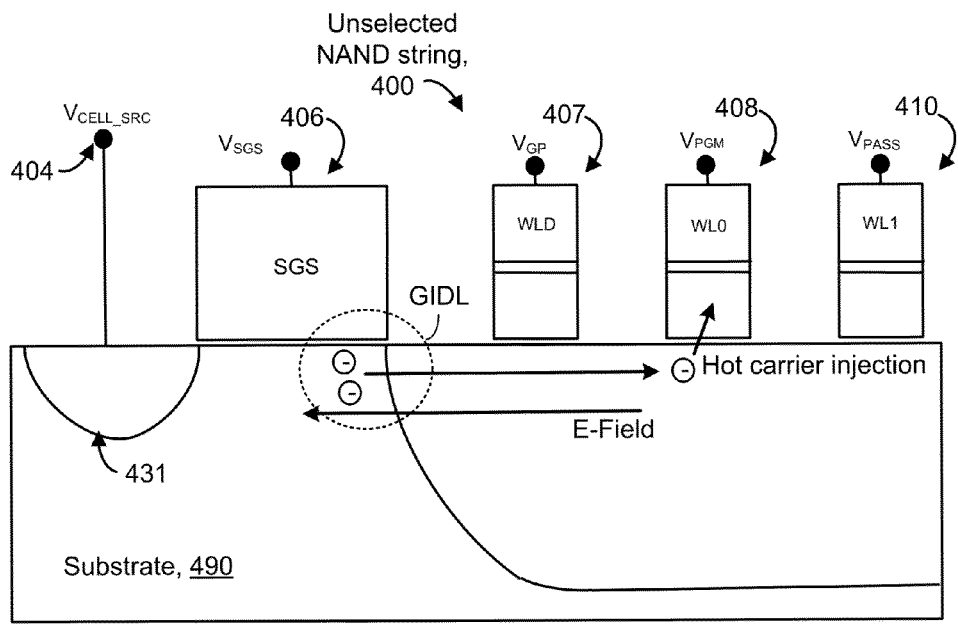
FIG. 18B shows a portion of the NAND string near the SGS transistor to shows GIDL effect.

Another possible problem that may occur to inhibited NAND strings during programming is GIDL. Referring now to FIG. 18B, GIDL may occur due to relatively low voltage to the gate of a SGS transistor 406. FIG. 18B shows a portion of the NAND string near the SGS transistor 406. Electrons may be generated in roughly the area depicted by the dashed region labeled "GIDL." There may be an Electric Field in which the electrons may be accelerated towards the channels of the memory cells. Some of these electrons may be injected into a floating gate of a memory cell that has a program voltage applied to its control gate via hot carrier injection. In some cases, electron injection in the floating gate of a memory cell may occur even when a relatively low voltage, such as Vpass, is applied to its control gate. These additional electrons may increase the Vth of the memory cell further than desired, thus creating program disturb. Note that this problem could affect memory cells that have been programmed to any data state, as well as those intended to stay erased.

As mentioned above, a GIDL protect voltage Vgp may be applied to the gate of a dummy memory cell. This voltage could be somewhat less than Vpass. Using a lower voltage than Vpass to the dummy may reduce the E-field both close to the SGS transistor and in the channel area in between SGS and the word lines, which may reduce both GIDL and the lateral electric field that is responsible for creating the hot electrons. However, this may not entirely eliminate GIDL or the GIDL induced hot electron injection. It is not required that there be a dummy memory cell 407 or that Vgp be applied to the memory cell closest to the select transistor.

In one embodiment, the voltage that is applied to the gate of the SGS transistor 406 during programming depends on the position of the selected word line. This may help to reduce or eliminate program disturb due to GIDL. For some programming schemes, GIDL induced program disturb for the SGS transistor 406 may be most problematic for lower word lines. In one embodiment, VSGS is increased when programming lower word lines to reduce GIDL. Therefore, GIDL induced hot electron injection may be reduced or eliminated for the lower word lines. Consequently, program disturb is reduced or eliminated.

Figure 18C:
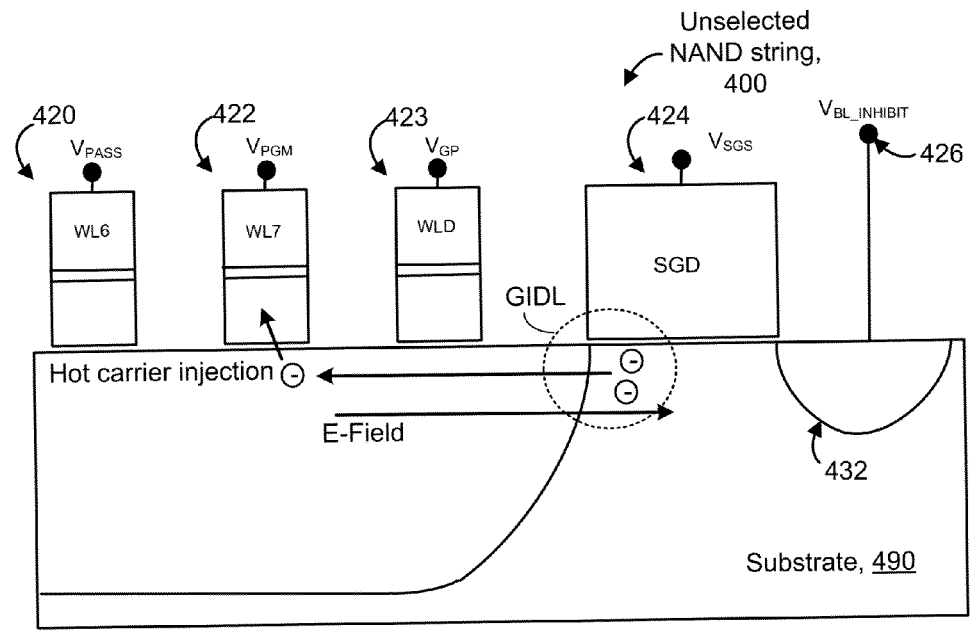
FIG. 18C shows a portion of the NAND string near the SGD transistor to shows GIDL effect.

GIDL may also be a problem on the drain side of the NAND string, as depicted in FIG. 18C. Referring now to FIG. 18C, GIDL may occur due to relatively low voltage to the gate of a SGD transistor 424. FIG. 18C shows a portion of the NAND string near the SGD transistor 424. In one embodiment, the voltage that is applied to the gate of the SGD transistor 424 during programming depends on the position of the selected word line. In one embodiment, VSGD is increased when programming the highest word lines (relative to those just below this) to reduce GIDL. This may help to reduce or eliminate program disturb due to GIDL at the drain side.

Figure 22A:
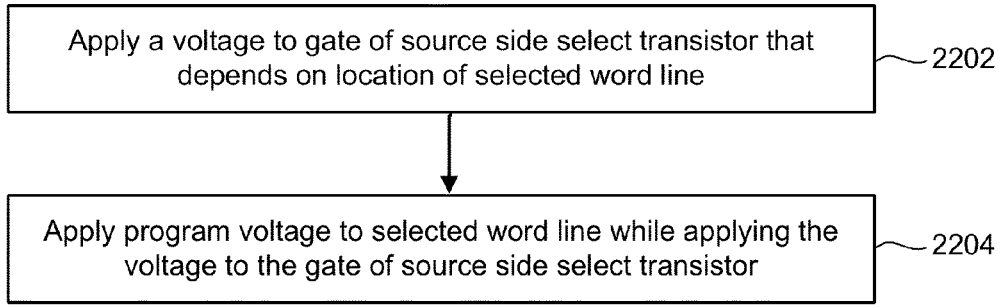
FIG. 22A depicts a flowchart of one embodiment of a process of programming non-volatile storage in which the magnitude of the voltage SGS depends on the location of the selected word line.

FIG. 22A depicts a flowchart of one embodiment of a process 2200 of programming non-volatile storage. Process 2200 is one embodiment of step 820 of process 800. In step 2202, a voltage is applied to a gate of an SGS transistor 406. The voltage depends on the location of the word line that is selected for programming. Referring to FIG. 9(A), the magnitude of the voltage SGS depends on the selected word line in one embodiment. In one embodiment, SGS is held at this voltage during both a bit line pre-charge (and boosting) phase and a program phase.

Figure 22B:
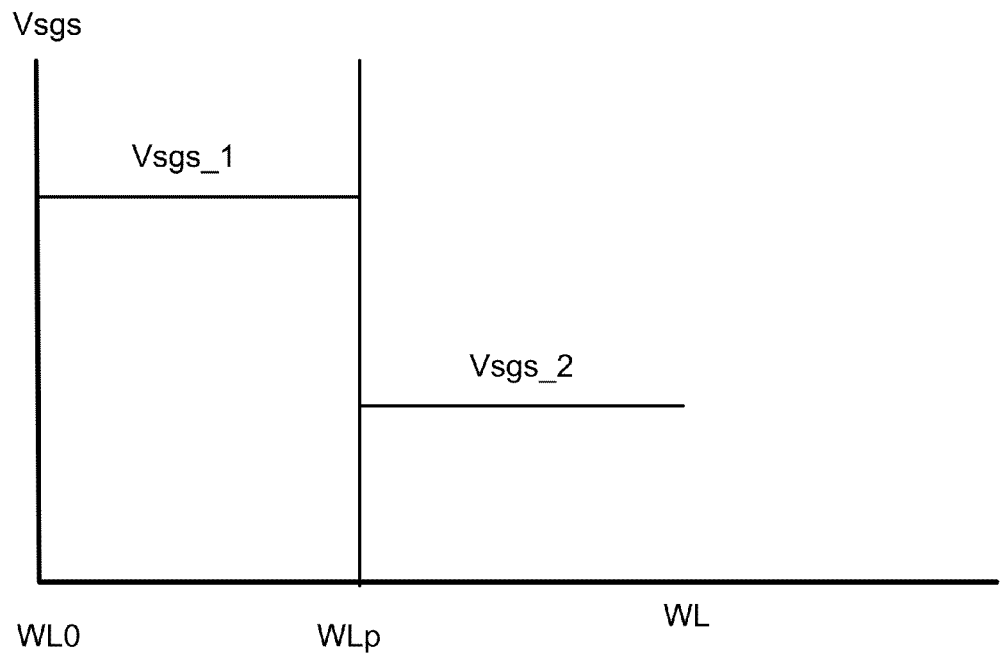
FIG. 22B shows voltage applied to a gate of a source side select transistor versus word line for one embodiment.

In one embodiment, Vsgs might be raised about 0.5V to prevent or reduce effects of GIDL. Vsgs could be raised by more or less than 0.5V to prevent or reduce effects of GIDL. Referring to FIG. 22B, for edge word lines from WL0 to WLp-1, Vsgs_1 is higher than Vsgs_2 for higher word lines (WLp to the highest word line). There may be one or more of the edge word lines near the SGS transistor 406 for which the higher voltage is applied to prevent or reduce effects of GIDL.

In some embodiments, Vsgs does not have the same value for all of the higher word lines. In such embodiments, the value of Vsgs for the edge word line(s) near the SGS transistor 406 is higher than the value of Vsgs for the lowest middle word line. For example, Vsgs is higher for WL0 than for WL1, such that effects of GIDL are reduced or prevented.

In one embodiment of step 2202, one of a plurality of different voltages could be applied to the gate of the SGS transistor 406, depending on the location of the selected word line. A highest voltage of the plurality of different voltages is applied to the gate when the selected word line is closest to the SGS transistor 406, in one embodiment. This may help to prevent or reduce effects of GIDL. A relatively high voltage may be applied to the gate when the selected word line is an edge word line near the SGS transistor 406. There may be one, two, three, or more edge word lines in this case.

In step 2204, a program voltage is applied to the selected word line while applying the voltage to the gate of the SGS transistor 406. Referring to FIG. 9(D), Vpgm may be applied to the selected word line during the program phase.

Various other signals depicted in FIG. 9 may also be applied during process 2200. Zero or more of these signals may have its value depend on the selected word line. In one embodiment, step 2202 of process 2200 is performed together with step 1902 of process 1900. Thus, the magnitude of the voltage applied to both the gate of the SGS transistor 406 and the diffusion region 431, 432 of one of the select transistors 406, 424 depend on the location of the word line selected for programming, in one embodiment.

Referring again to FIG. 18C, GIDL may also occur on the drain side of the NAND string. For some programming schemes GIDL induced program disturb for the SGD transistor 424 may be most problematic for higher word lines. In one embodiment, VSGS is increased to reduce GIDL. Therefore, GIDL induced hot electron injection may be reduced or eliminated for the higher word lines. Consequently, program disturb is reduced or eliminated.

FIG. 23A depicts a flowchart of one embodiment of a process 2300 of programming non-volatile storage. Process 2300 is one embodiment of step 820 of process 800. In step 2302, a voltage is applied to a gate of a SGD transistor 424. The voltage depends on the location of the word line that is selected for programming. Referring to FIG. 9(B), the magnitude of the voltage on the drain select line SGD depends on the selected word line in one embodiment. Note that the voltage on SGD might be altered during the program operation, as in the embodiment of FIG. 9(B). In one embodiment, the value of V_SGD during the program phase depends on the location of the selected word line. In one embodiment, the value of V_SG during the bit line precharge and boosting phase depends on the location of the selected word line.

Figure 23B:
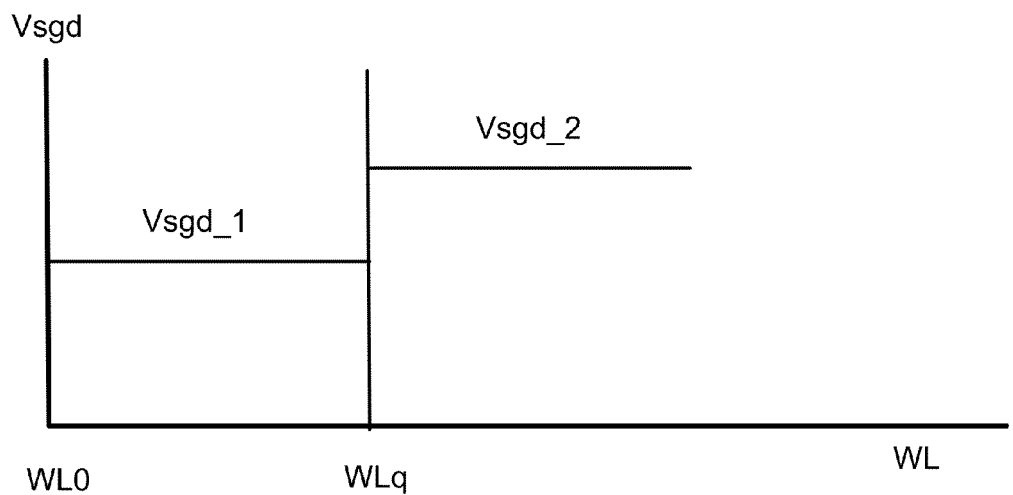
FIG. 23B shows voltage applied to a gate of a drain side select transistor versus word line for one embodiment.

In one embodiment, V_sgd might be raised about 0.5V for edge word lines to prevent GIDL. Referring to FIG. 23B, for edge word lines from WLq to the highest word line, Vsgd_2 is higher than Vsgs_1. There may be one or more of the edge word lines near the SGD transistor 424 for which the higher voltage is applied to prevent or reduce effects of GIDL.

In some embodiments, Vsgd does not have the same value for all of the lower word lines. In such embodiments, the value of Vsgd for the edge word line(s) near the SGD transistor 424 is higher than the value of Vsgd for the highest middle word line. For example, Vsgd is higher when programming WL63 than for WL62, such that effects of GIDL associated with the SGD transistor 424 are reduced or prevented.

In step 2304, a program voltage is applied to the selected word line while applying the voltage to the bit lines of unselected NAND strings. Referring to FIG. 9(D), Vpgm may be applied to the selected word line during the program phase.

Various other signals depicted in FIG. 9 may also be applied during process 2300. Zero or more of these signals may have its value depend on the selected word line.

To further reduce the risk of GIDL, during programming with a higher value for V_SGS and/or V_SGD, all or some of the bitline biases can also be increased. This may help to make sure that the SGS transistor 406 and/or to maintain sufficient margins V_SGD. In one embodiment, the increase in the bit line biases are about the same as the increase in the biases to SGS and SGD. However, the increase in the bit line biases could be slightly less or slightly more than the increase in the biases to SGS and SGD. FIG. 24 depicts a flowchart of one embodiment of a process 2400 of programming non-volatile storage. Process 2400 is one embodiment of step 820 of process 800.

In step 2402, a voltage is applied to bit lines associated with NAND strings that are selected for programming. The voltage depends on the location of the word line that is selected for programming. In one embodiment, a higher voltage is applied to the selected bit lines when applying a higher voltage to the SGS transistors 406. For example, this is used when programming the lower edge word lines. This may help to ensure that the SGS transistors are cut off. In one embodiment, a higher voltage is applied to the selected bit lines when applying a higher voltage to the SGD transistors 424. For example, this is used when programming the higher edge word lines.

Referring to FIG. 9(G), the magnitude of the voltage VBL_select depends on the selected word line in one embodiment. In one embodiment, the voltage may first be applied at about the same time that the unselected bit lines are first charges (e.g., at the start of phase 2 in FIG. 9). The voltage may be maintained during the program phase.

In one embodiment, the voltage VBL_select may be about 0V for a "normal" situation when the higher voltage is not used for V_sgs or V_sgd. However, VBL_select may be raised by about the same amount as the increase in V_sgs or V_sgd, in one embodiment. Note that the increase in VBL_select could be slightly less or slightly more than the increase to V_sgs or V_sgd. As one example, VBL_select is increased by about 0.5V for when edge word lines are selected for programming. For example, VBL_select could be about 0.5V for edge word lines and about 0V for middle word lines.

Process 2400 describes an Option A in which biases for unselected bit lines depend on the location of the selected word line and Option B is which they do not. In optional step 2404a, a voltage that depends on the location of the word line that is selected for programming is applied to bit lines associated with NAND strings that are not selected for programming (also referred to as inhibited NAND strings). Referring to FIG. 9(E), the magnitude of the voltage VBL_inhibit depends on the selected word line, in one embodiment.

In optional step 2404b, the voltage applied to bit lines associated with NAND strings that are not selected for programming does not depend on the location of the word line selected for programming. Referring to FIG. 9(E), the magnitude of the voltage VBL_inhibit may be independent of the selected word line.

In one embodiment, the voltage VBL_inhibit may be about 2.2V for a "normal" situation when the higher voltage is not used for V_sgs or V_sgd. However, VBL_inhibit may be raised by about the same amount as the increase in V_sgs or V_sgd, in one embodiment. Note that the increase in VBL_inhibit could be slightly less or slightly more than the increase to V_sgs or V_sgd. As one example, VBL_inhibit is increased by about 0.5V for when edge word lines are selected for programming. For example, VBL_inhibit could be about 2.7V for edge word lines and about 2.2V for middle word lines (assuming an increase of about 0.5V for V_sgd).

Using the higher value for VBL_inhibit along with the higher value for V_sgs may help to maintain the V_sgd margins. Note that if the V_sgd margin is adequate then increasing VBL_inhibit may not be needed. Therefore, VBL_inhibit is not necessarily increased when increasing V_sgd for the upper edge word lines.

Process 2400 describes an Option C in which biases for bit lines associated with NAND strings in a slow programming mode depend on the location of the selected word line and Option D is which they do not. In optional step 2406a, a voltage that depends on the location of the word line that is selected for programming is applied to bit lines associated with NAND strings that are selected for slow programming. Slow programming may also be referred to as "quick pass write" (QPW). Referring to FIG. 9(F), the magnitude of the voltage VBL_QPW depends on the selected word line in one embodiment.

In optional step 2406b, the voltage applied to bit lines associated with NAND strings that are not selected for slow programming does not depend on the location of the word line selected for programming. Referring to FIG. 9(F), the magnitude of the voltage VBL_QPW may be independent of the selected word line. Note that any combination of steps 2404 and 2406 may be performed. That is, option A may be used with option C or option D. Likewise, option B may be used with option C or option D.

In one embodiment, the voltage VBL_QPW may be about 0.7V for a "normal" situation when the higher voltage is not used for V_sgs or V_sgd. However, VBL_QPW may be raised by about the same amount as the increase in V_sgs or V_sgd, in one embodiment. Note that the increase in VBL_QPW could be slightly less or slightly more than the increase to V_sgs or V_sgd. As one example, VBL_QPW is increased by about 0.5V for when edge word lines are selected for programming. For example, VBL_QPW could be about 1.2V for edge word lines and about 0.7V for middle word lines (assuming an increase of about 0.5V for V_sgs and/or V_sgd).

In step 2404, a program voltage is applied to the selected word line while applying the voltage from step 2402 to the bit lines of selected NAND strings (as well as whatever voltage is applied to other bit lines in steps 2404 and 2406). Referring to FIG. 9(D), Vpgm may be applied to the selected word line during the program phase.

Various other signals depicted in FIG. 9 may also be applied during process 2300. Zero or more of these signals may have its value depend on the selected word line. In one embodiment, process 2400 is performed with process 2200 and 2300.

Selected Word Line Dependent Select Gate Voltage

In one embodiment, the voltage applied to the gate of a select transistor 406, 424 of a NAND string depends on the location of the word line selected for programming. This may eliminate or mitigate effects caused by drain induced barrier lowering (DIBL). If DIBL occurs, it may lower the Vth of a select transistor 406, 424. If this happens, a select transistor 406, 424 that should be off may turn on, at least weakly, wherein charge may leak from a boosted channel of an inhibited NAND string. Applying a selected word line dependent voltage to the gate of a select transistor 406, 424 may keep the transistor off, thereby preventing charge leakage from a boosted channel. Therefore, program disturb may be reduced or eliminated. The voltage applied to the gate of the select transistor 406, 424 may also reduce or eliminate other effects, such as GIDL.

In one embodiment, the voltage whose magnitude depends on the selected word line is applied to the gate of an SGS transistor 406. In one embodiment, a negative voltage is applied to the gate of the SGS transistor 406 for at least some positions of the selected word line. For example, a negative voltage may be applied to the gate of the SGS transistor 406 when the selected word line is a middle word line or an edge word line near the SGD transistor 424. This may prevent charge leakage from a boosted channel that could occur as a result of DIBL. However, a voltage with a greater magnitude may be applied to the gate of the SGS transistor 406 when the selected word line is an edge word line near the SGS transistor 406. This may prevent or reduce effects of GIDL. Therefore, program disturb may be reduced or eliminated.

In one embodiment, the voltage whose magnitude depends on the selected word line is applied to the gate of a SGD transistor 424. The voltage may be selected to prevent charge leakage from a boosted channel that could otherwise occur as a result of DIBL.

For some boosting schemes, the channel capacitance is smaller for higher word lines. Therefore, when higher word lines are selected for programming, the voltage of the boosted channel may drop faster for a given leakage current. In one embodiment, a lower magnitude voltage is used for the gate of the SGD transistor 424 when the selected word line is closer to SGD transistor 424. In other words, the voltage may decrease with increasing word lines. This may help compensate for the smaller channel capacitance when programming higher word lines (e.g., those closer to the SGD transistor 424).

Figure 25:
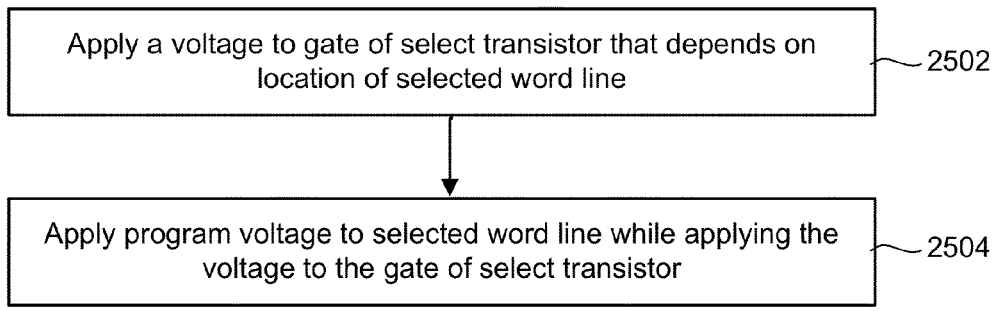
FIG. 25 depicts a flowchart of one embodiment of a process of programming non-volatile storage in which the voltage applied to a gate of a select transistor depends on the location of the selected word line.

FIG. 25 depicts a flowchart of one embodiment of a process 2500 of programming non-volatile storage in which the voltage applied to a gate of a select transistor depends on the location of the selected word line. Process 2500 is one embodiment of step 820 of process 800. In step 2502, a voltage is applied to a gate of a select transistor 406, 424. The voltage depends on the location of the word line that is selected for programming. In one embodiment, a selected word line dependent voltage is applied to the gate of an SGS transistor 406. In one embodiment, a selected word line dependent voltage is applied to the gate of an SGD transistor 424.

Figure 26A:
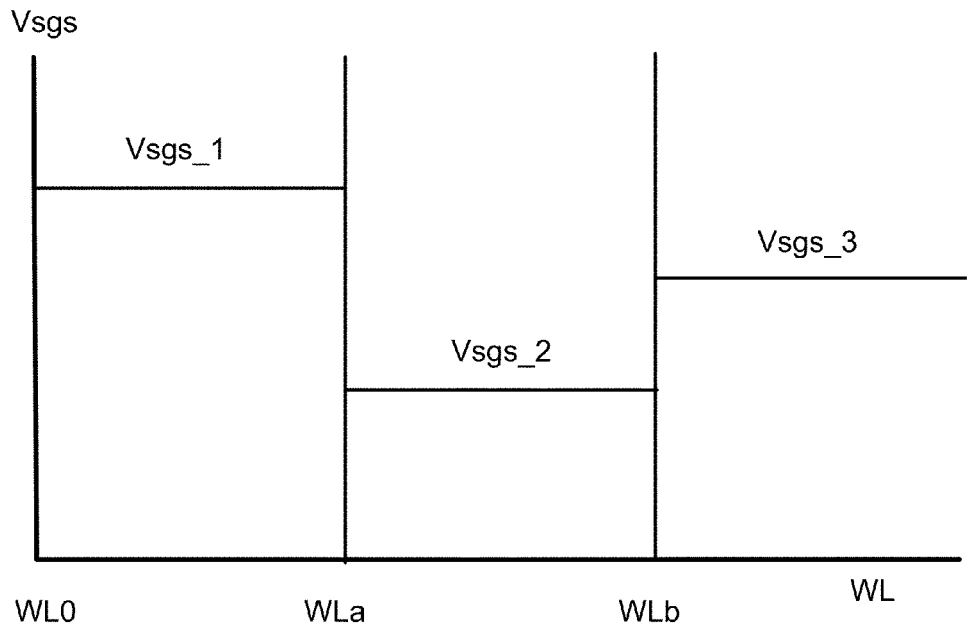
FIG. 26A shows relative values for Vsgs versus word lines in accordance with one embodiment.

Referring to FIG. 9(A), the magnitude of the voltage, V_sgs, to the source side select line SGS depends on the selected word line in one embodiment. In one embodiment, SGS is held at this voltage during at least a program phase. In one embodiment, the value for the Vsgs is selected to mitigate the effects of DIBL. In one embodiment, a negative value is used for Vsgs when the selected word line is a middle word line or an edge word line near the SGD transistor 424. This may prevent or reduce charge leakage of boosted channels that might otherwise occur due to increase in Vth of the source side select transistor due to DIBL. In one embodiment, a higher voltage is used when the selected word line is an edge word line near the SGS transistor 406. In one embodiment, V_SGS may be about 0V to prevent GIDL when programming an edge word line near the SGS transistor 406. FIG. 26A shows one example of values for V_sgs for step 2502.

Referring to FIG. 9(B), the magnitude of the voltage to the drain side select line SGD depends on the selected word line in one embodiment. In one embodiment, the value for V_SGD during program phase depends on the location of the selected word line. In one embodiment, the value for V_SG during the bit line precharge and boosting phase depends on the location of the selected word line. In one embodiment, the value for the Vsgd is selected to mitigate the effects of DIBL. In one embodiment, lower values are used for Vsgd for higher word lines (see FIG. 26B as one example).

In step 2504, a program voltage is applied to the selected word line while applying the voltage to the bit lines of unselected NAND strings. Referring to FIG. 9(D), Vpgm may be applied to the selected word line during the program phase. Thus, in one embodiment, process 2500 includes applying a control voltage to the source side select line (SGS) while applying the program voltage, wherein the control voltage has a magnitude that depends on the location of the selected word line. In one embodiment, process 2500 includes applying a control voltage to the drain side select line (SGD) while applying the program voltage, wherein the control voltage has a magnitude that depends on the location of the selected word line.

Various other signals depicted in FIG. 9 may also be applied during process 2500. Zero or more of these signals may have its value depend on the selected word line. In one embodiment, step 2502 of process 2500 is performed together with steps 2404-2406 of process 2400 (which may provide protection for effects of GIDL). Thus, the magnitude of the voltage applied to both the gate of at least one select transistor 406 and/or 424 and at least the selected bit lines (and optionally the unselected bit lines and bit lines for slow programming NAND strings) depend on the location of the word line selected for programming, in one embodiment.

FIG. 26A shows relative values for Vsgs versus word lines in accordance with one embodiment. As noted, Vsgs may be applied to SGS during a program operation (see FIG. 9(A), for example). This may provide a voltage to the gates of SGS transistors 406. In this embodiment, word lines are divided into three zones. In general, there may be two or more zones. In this embodiment, Vsgs has the highest magnitude (Vsgs_1) for the lowest word lines (e.g., WL0-WLa). There may be one or more word lines in this first zone (which may be referred to as edge word lines). In one embodiment, the value of Vsgs_1 is about 0V for the edge word lines near the SGS transistor 406. More generally, Vsgs_1 is a higher magnitude that at least Vsgs_2, in one embodiment. This may help to prevent or reduce effects associated with GIDL. Mitigating effects of GIDL has been discussed above.

In one embodiment, Vsgs has a negative value for word lines other than edge word lines near the SGS transistor 406. In other words, a negative voltage may be applied to the gate of the SGS transistor 406 if the selected word line is a middle word line or an edge word line near the SGD transistor 424. In one embodiment, Vsgs_2 and Vsgs_3 are negative. Using a negative voltage may prevent or reduce program disturb that might otherwise occur as a result of DIBL.

However, as noted above, to prevent or mitigate effects of GIDL a voltage (e.g., Vsgs_1) that is greater than the negative voltage Vsgs_2 may be applied to the gate of the SGS transistor 406 if the selected word line is an edge word line near the source side select transistor 406 (Vsgs_1 could be about 0V, but a higher or lower voltage could be used).

In one embodiment, the magnitude of Vsgs is lower (e.g., more negative) for middle word lines (e.g., WLa to WLb-1) than for edge word lines near the SGD transistor 424 (e.g., WLb to the highest word line). In this example, the value for Vsgs_2 is shown as being lower than Vsgs_3. However, this is not a requirement. Instead Vsgs_3 could be the same value or lower than Vsgs_2.

In one embodiment, the value for Vsgs_2 is between about −0.5V to about −1.0V. In one embodiment, the value for Vsgs_3 is between about −0.5V to about −1.0V. However, note that the value could be lower or higher for each case. In one embodiment, the value for Vsgs_2 is between about −0.5V to about −1.0V. In one embodiment, the value for Vsgs_1 is about 0V; however, it could be lower or higher.

Figure 26B:
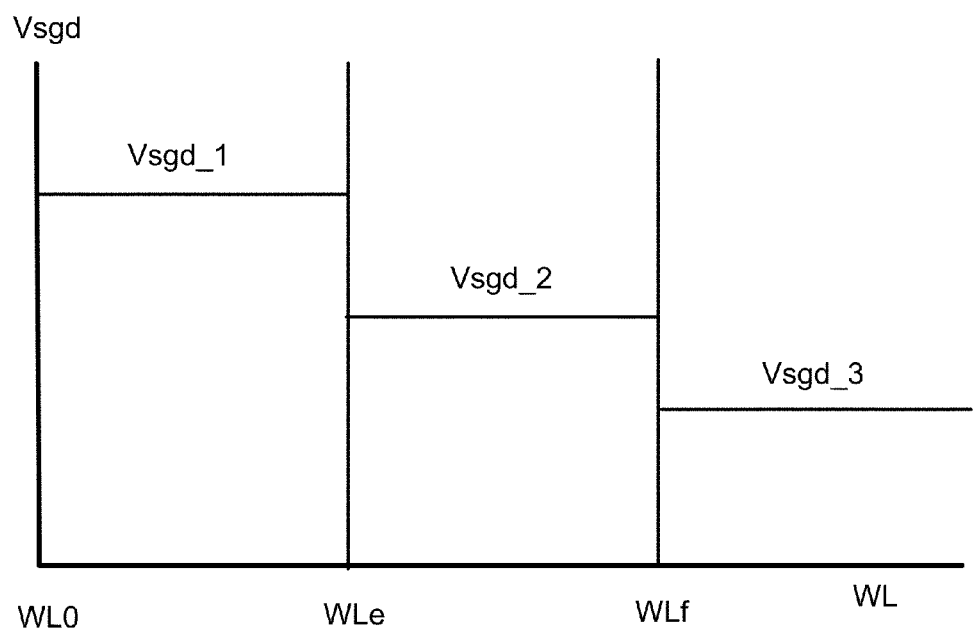
FIG. 26B shows relative values for Vsgd versus word lines in accordance with one embodiment.

FIG. 26B shows relative values for Vsgd versus word lines in accordance with one embodiment. As noted, Vsgd may be applied to SGD during a program operation (see FIG. 9(B), for example). This may provide a voltage to the gates of SGD transistors 424. In this embodiment, word lines are divided into three zones. In general, there may be two or more zones. In this embodiment, Vsgd has the highest magnitude (Vsgs_1) for the lowest word lines (e.g., WL0 to WLe-1). There may be one or more word lines in this first zone (which may be referred to as edge word lines).

In one embodiment, the magnitude of Vsgd is progressively lower for word lines in higher zones. In this example, Vsgd_2 is lower than Vsgd_1. Likewise, Vsgd_3 is lower than Vsgd_3. In other words, the voltage applied to the gate of the SGD transistor 424 may be lower if the selected word line is closer to the SGD transistor 424.

In one embodiment, the value for Vsgd_1 is about 1.6V. Voltages for Vsgd_2 and Vsgd_3 may be even lower. Note that when programming higher word lines the capacitance of the boosted channel may be smaller, at least for some boosting schemes. thus, using even lower voltages for higher selected word lines may better minimize boosted charge leakage.

When a memory cell is inhibited from programming, its channel may be boosted up to a high potential (e.g., 4V to 9V depending on the data-pattern on the neighboring cells). Also, the channel potential may depend on which word line is selected for programming. Moreover, the channel potential could vary from one end of the NAND string to the other, depending on the boosting mode. For example, FIG. 21D shows an EASB mode in which the channel potential for lower word lines is relatively low when a higher word line is selected for programming. Therefore, the boosted channel voltage may depend on which word line is selected for programming.

During one embodiment of programming, the CELSRC may be at a relatively low voltage (e.g., 0V to 2V). As noted, channels of inhibited NAND strings may be at a significantly higher voltage. Thus for boosted channels, a Vds may exist across the SGS transistor 242. If the Vds is high enough, it may lower the Vth of the SGS transistor 406 due to DIBL. The lower Vth can cause the SGS transistor 406 to turn on, which may cause boost potential leakage through the SGS transistor 406, resulting in program disturb. This phenomenon may become even worse as the size of memory arrays continue to scale downwards due to further scaled SGS transistor 406.

As noted, the boosted channel potential may depend on which word line is being programmed, at least for some boosting schemes. For some boosting schemes the channel potential at the source end of the NAND string is greater when lower word lines are being programmed. Thus, this DIBL induced problem could be worse when programming lower word lines. It may also be worse for middle word lines than for edge word lines near the SGD transistor 424. Referring back to FIG. 26A, Vsgs could be higher for the higher word lines (compared to middle word lines) in view of the foregoing. However, as noted above, GIDL may also be a problem when programming edge word lines near the SGS transistor 406. Therefore, a higher voltage may be used when programming those edge word lines (relative to the lowest middle word lines) to combat effects of GIDL.

Figure 27A:
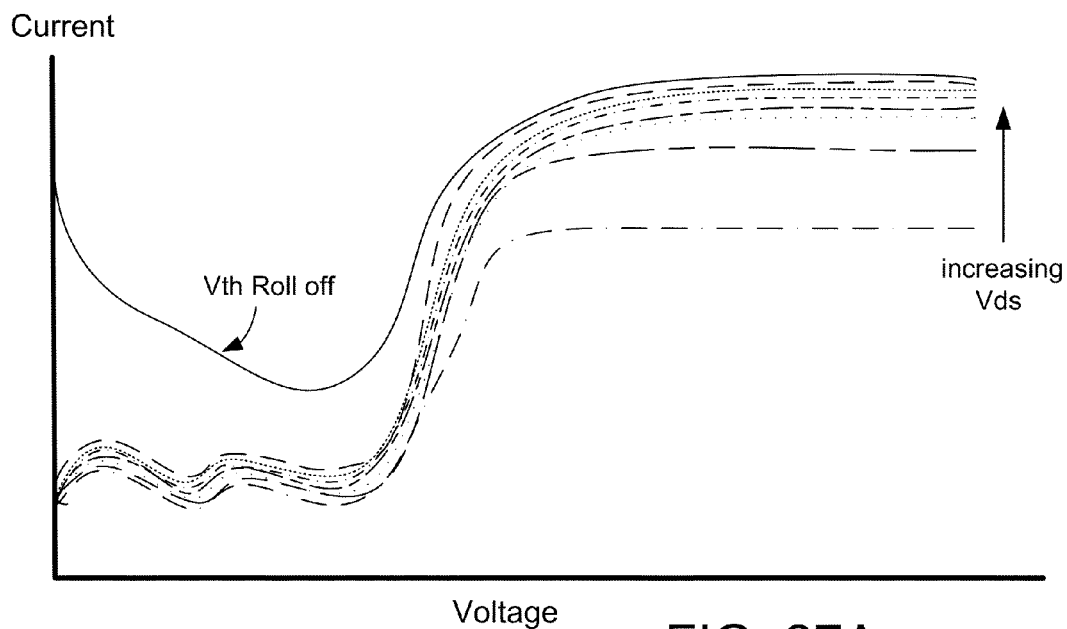
FIG. 27A and FIG. 27B shows possible effects of DIBL on the Vth of SGS transistors.
Figure 27B:
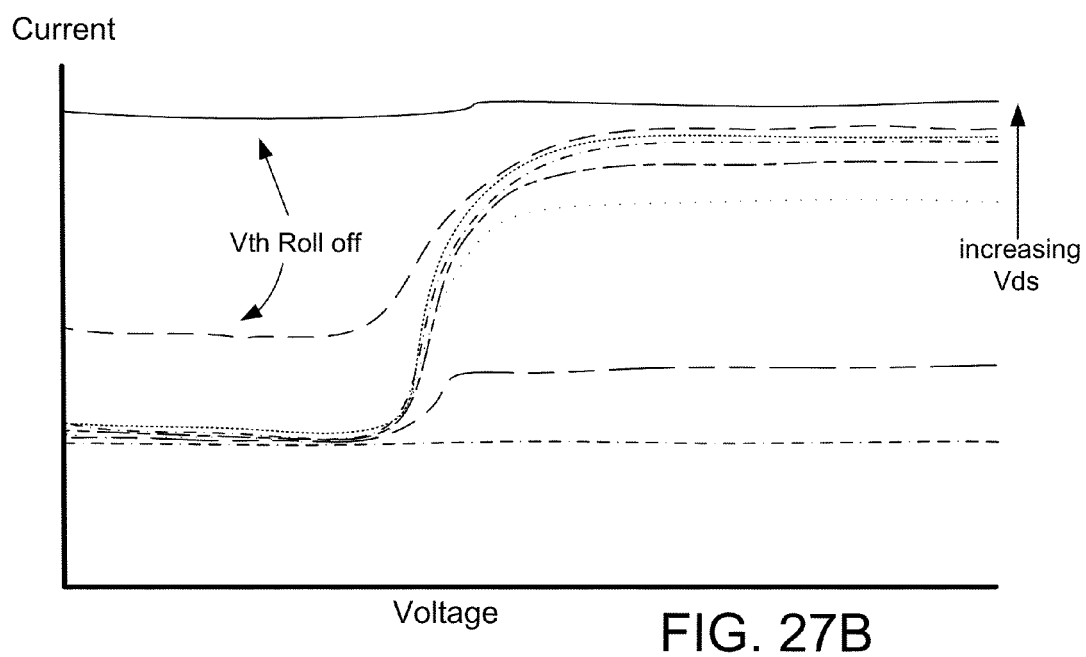

FIG. 27A and FIG. 27B shows possible effects of DIBL on the Vth of SGS transistors 406. Each show the Vth roll off due to DIBL. Each curve shows current versus Vgs for a different value of Vds. The label "increasing Vds" indicates which curves have the higher Vds. In FIG. 27A, the curve for the highest Vds has significant Vth rolloff. FIG. 27B is for a transistor with a smaller channel width. In this case, two of the curves show significant Vth roll off. Therefore, the Vth roll off problem may become more severe with further scaling of memory arrays.

For NAND operation, the bias, Vsgd, on the SGD transistor 424 may have an optimum range under which it should be operated for normal program and inhibit operation. If Vsgd is too high or too low, it can lead to certain issues that can either cause problems with inhibiting or programming the cells, leading to higher failure bit count (FBC). Therefore, there may be a Vsgd-window which dictates the values of Vsgd bias under which the SGD transistor 424 should be operated within.

Figure 28:
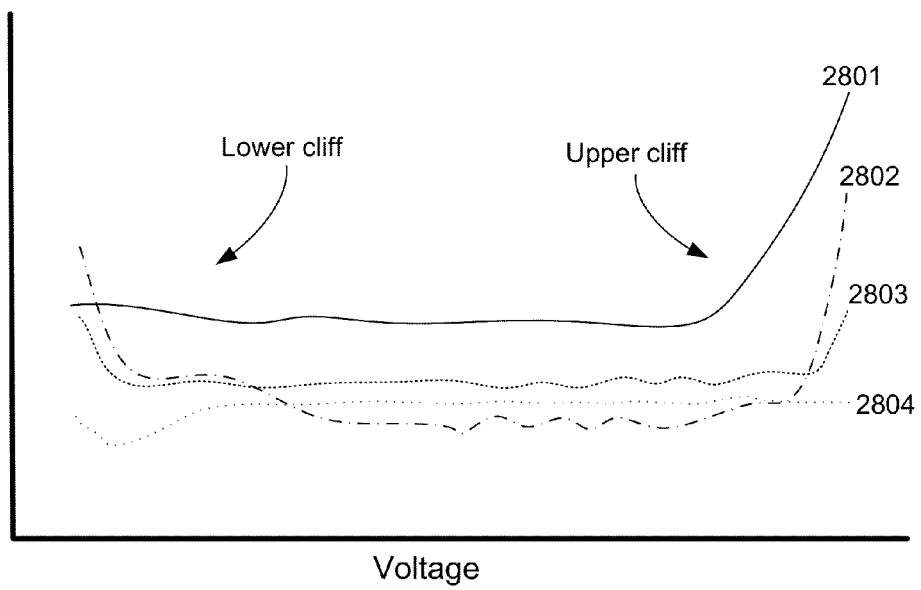
FIG. 28 shows a possible Vsgd window.

A possible Vsgd window for is shown in FIG. 28. The window shows an upper cliff and a lower cliff. Possible mechanisms governing the upper and lower cliffs of the Vsgd window are described below. Curve 2801 is for Er-x fails. Curve 2802 is for A-x fails. Curve 2803 is for B-x fails. Curve 2804 is for C-x fails.

First, the Vsgd window upper-cliff mechanism will be discussed. This cliff may be related to boost leakage through the SGD transistor 424 leading to Er to X fails ("X" refers to any state above Erase). To inhibit a memory cell from programming, its channel should be boosted to a high enough potential to prevent electrons from moving from the channel to the floating gate. So that the boost potential does not leak away through the SGD transistor 424, Vsgd should be low enough to ensure that the SGD transistor 424 is off for boosted channels. If Vsgd is too high, then the SGD transistor 424 will turn on and lead to boost potential leakage through the SGD transistor 424. This could cause program disturb leading to E->A fails and eventually A->B, B->C fails, if Vsgd is further raised. Thus in practice, the upper-cliff of Vsgd window may be determined by E->X fails.

Now, the Vsgd window lower-cliff mechanism will be discussed. The Vsgd window lower-cliff mechanism may be related to QPW over-programming (OP) on memory cells in QPW mode leading to A->X, B->X fails. In one embodiment, a memory cell that is in QPW mode has its associated bitline biased to VBL_QPW. So that the full VBL_QPW is passed through the SGD transistor 424 into the NAND chain, the SGD transistor 424 should stay on. If Vsgd is too low, this can cause the SGD transistor 424 to be weakly off, which may cause the channels under QPW to get weakly boosted. A weakly boosted channel may slow down the program speed for the associated memory cells.

Now, consider a situation under which such a memory cell on BLn is programming slowly while its neighboring channels (BLn-1/BLn+1) are also programming or are in QPW mode.

Assuming that NAND strings n-1 and n+1 (hereinafter, BLn-1/n+1) are either programming or slow programming, then those channels may be at about 0V or 0.9V. Assume that on program Pulse #N one or both of the BLn-1/n+1 cells reach their target level. Then, on Pulse #N+1, these BLn-1/n+1 may be biased to an inhibit voltage and their channels will be boosted up to Vboost.

Due to this sudden change in BLn-1/n+1 channel's state from a lower voltage to a high voltage (e.g., Vboost), the SGD transistor 424 on BLn can suddenly now turn on due to the impact of neighbor bitlines and its channel. When the BLn-1/n+1 channels are boosted, the SGD transistors may be OFF, the drain-side of their SGD transistors 424 may be at about Vdd, and the source-side of their SGD transistors 424 may be at Vboost. The drain and source of the SGD transistor 424 on BLn-1/n+1 can act as side gates to the SGD transistor 424 on BLn, which may turn on the channel under the SGD transistor 424 for BLn. This may cause the channel potential on BLn to suddenly change from weakly boosted to VBL_QPW, which may suddenly increase the program speed for those memory cells. This increase in programming speed could lead to a large Vth increase, thereby resulting in over-programming (OP) failures. Assuming that the A-state and B-state use the QPW mode, this could specifically lead to A->B and B->C failures (otherwise referred to as QPW-OP fails).

Figure 29:
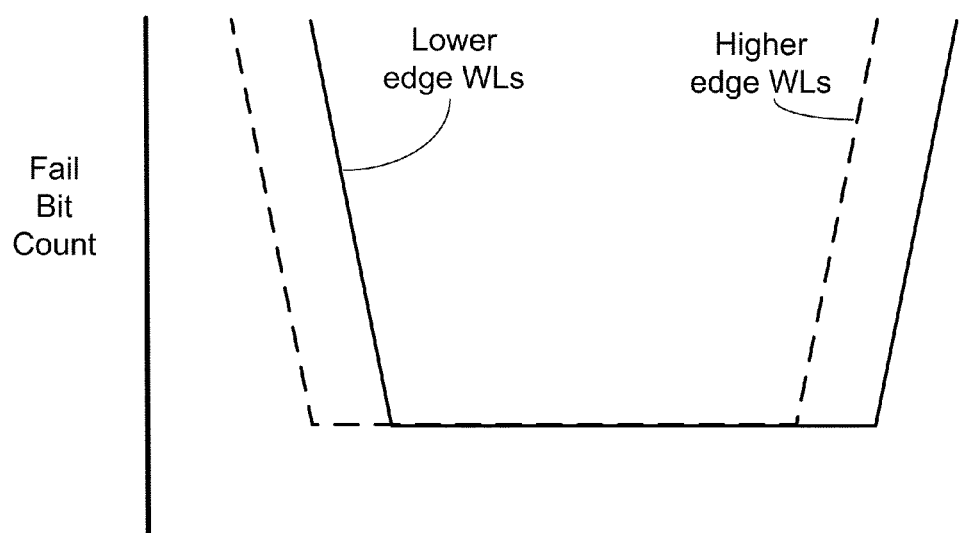
FIG. 29 shows possible word line dependence of the lower-cliff and upper-cliff of Vsgd window.

Next, the selected word line dependence of the Vsgd window will be discussed. FIG. 29 shows a schematic of the difference between Vsgd window for higher edge WLs and lower edge WLs for one possible memory device. For higher edge WLs, the Vsgd window is shifted down as compared to the lower edge WLs. Thus, for such a memory device, in order to be at the optimum Vsgd value (center of Vsgd window) during program for lower WLs, a higher Vsgd bias may suitable to use, while for higher WLs a lower Vsgd bias should be used. Other memory devices may have other characteristics.

First, the upper cliff will be discussed. As explained earlier, the upper-cliff of Vsgd-window may be due to boost leakage from the channel through the SGD transistor 424, leading to E->X fails. When programming lower WLs (e.g., WLn), all higher drain-side WLs (WLn+2 and higher) may be in the erased state, depending on the programming scheme used. Thus, the channels of memory cells associated with the word lines on the drain side of the NAND string may be fully connected with the channel of the memory cell associated with WLn. Also, the boosting potential underneath the erased cells may be higher than that underneath programmed cells (higher Vth cells may have lesser boost potential than lower Vth cells under the same Vpass). The net result is that while programming lower WLs, the boosted channel potential may be higher and the boosted channel capacitance may be larger. On the other hand, for higher WLs programming, the boost potential may be lower and the channel capacitance may be smaller.

At Vsgd-window upper-cliff, the boost leakage can be envisioned as a charged capacitor (channel in this case) leaking away during the program-time. The potential for a smaller capacitor leaks away much faster than that for a larger capacitor. Thus, for higher WLs, the leakage of the boost potential within the program-time may be larger than for lower WLs, and hence the upper-Vsgd margin may be smaller. For the same reason, at a given higher Vsgd value, higher WLs may have a greater FBC than lower WLs (see FIG. 29).

Next, the lower cliff will be discussed. As explained earlier, the lower-cliff of Vsgd-window may be due to QPW-OP on the cells under QPW mode. The QPW-OP for a given NAND string may occur when its neighboring NAND strings channels suddenly switch from program to inhibit which may result in its SGD transistor 424 suddenly turning on due to high potential on the drain and source side of the SGD transistors 424 of neighbor NAND strings. The drain and source side of the neighbor SGD transistors 424 may act as side gates for SGD transistor 424 on NAND string n. The net impact of this phenomena may be dependent on the net potential swing that occurs on the drain/source of BLn−1/n+1 SGD transistors 424. Once the BLn−1/n+1 are inhibited, drain-side of their SGD transistors 424 may be fixed at Vbl_inhibit, and the source side may be at Vboost. Thus, if Vboost is high, then more cells may be impacted by QPW-OP. As mentioned above, the boost potential (Vboost) may be larger during lower WLs programming. Thus, the QPW-OP issue may impact lower WLs more than the higher WLs, and hence lower-WLs may have smaller margin on lower-side of Vsgd window. For the same reason, at lower Vsgd values, lower WLs tend to have more FBC (see FIG. 29).

Thus the lower-cliff and upper-cliff of Vsgd window tend to have opposite WL-dependence as shown in FIG. 29. The Vsgd window for higher WLs may be shifted lower as compared to lower WLs. Therefore, in one embodiment, the overall Vsgd window is maximized by using a lower Vsgd when programming higher WLs, and a higher Vsgd when programming lower WLs. FIG. 26B shows one embodiment of such a scheme. As noted, there may be any number of "zones," each of which may contain any number of word lines.

Figure 30A:
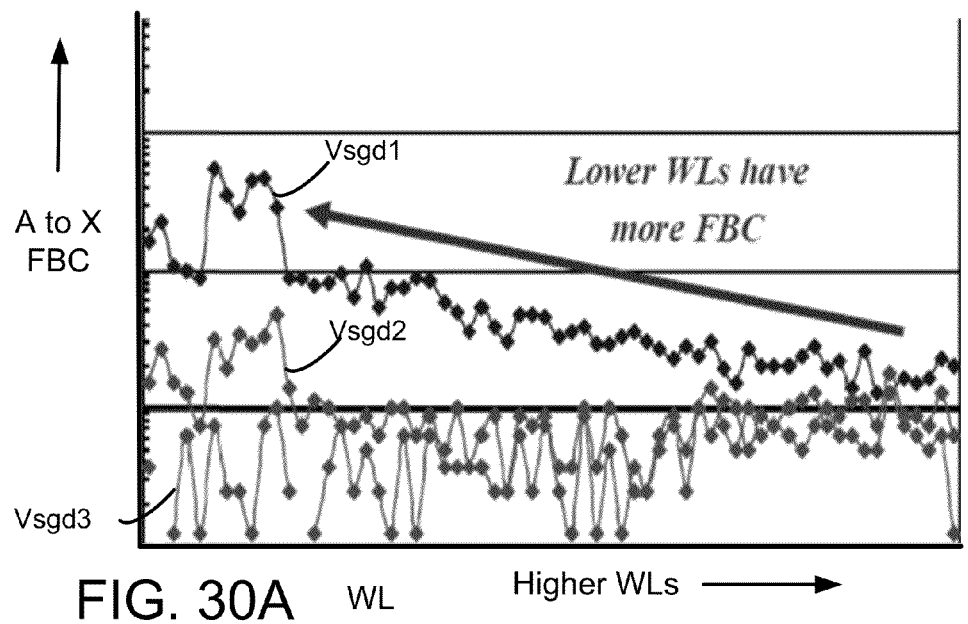
FIG. 30A and FIG. 30B show possible failure bit count versus word line.
Figure 30B:
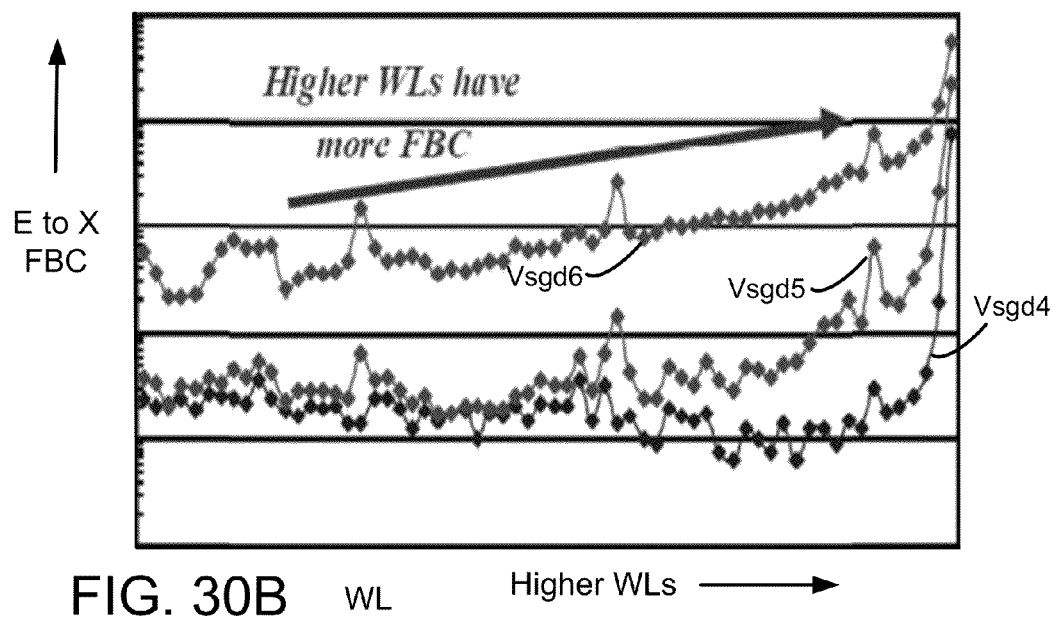

FIGS. 30A and 30B show Fail Bit Count (FBC) versus word line for different values of Vsgd. FIG. 30A shows A to X fails for lower values of Vsgd. Vsgd1 is the very lowest followed by Vsgd2 and Vsgd3. FIG. 30B shows E to X fails for higher values of Vsgd. Vsgd6 is the very highest with Vsgd5 and Vsgd4 being lower in magnitude. All Vsgd in FIG. 30B are significantly higher than each of the Vsgd in FIG. 30A.

As shown in FIG. 30A, the lower-cliff of Vsgd window may be dominated by A->X fails. FIG. 30B shows that the upper-cliff is dominated by E->X fails. FIG. 30A shows that for the lower-cliff, lower WLs a have smaller margin. FIG. 30B shows that for the upper-cliff, higher WLs have a smaller margin. Therefore, in one embodiment, a lower Vsgd value is used during higher WLs programming and higher Vsgd value is used during lower WLs programming, in order to maximize the net Vsgd window width.

Note that the highest word line may have an exceptionally high FBC. Thus, in one embodiment, a unique low Vsgd value for the highest WL is used. In other words, the value for Vsgd when programming the highest word line is lower than for any other word line, in one embodiment. In one embodiment, a unique low Vsgd value is used for the highest edge word lines, such as the highest two, three, or more word lines.

One embodiment includes a method of operating non-volatile storage, comprising applying a programming voltage to a selected word line that has a duration that depends on the width of the selected word line.

One embodiment includes a non-volatile storage device, comprising a plurality of non-volatile storage elements arranged as NAND strings, a plurality of word lines associated with the plurality of non-volatile storage elements, and one or more managing circuits in communication with the plurality of word lines. The one or more managing circuits apply a programming voltage to a selected word line of the plurality of word lines. The programming voltage has a duration that depends on the width of the selected word line.

One embodiment includes a method of operating non-volatile storage, comprising programming non-volatile storage elements associated with a plurality of word lines. The non-volatile storage elements are arranged as a plurality of NAND strings. The plurality of word lines are arranged from lowest to highest from a first end to a second end of the plurality of NAND strings. The programming includes applying a programming signal for a given program loop having a shorter pulse width when either the lowest word line or the highest word line is selected for programming than the pulse width used to program at least one other word line of the plurality of word lines.

One embodiment includes a non-volatile storage device, comprising a plurality of non-volatile storage elements arranged as NAND strings, a plurality of word lines associated with the plurality of non-volatile storage elements, and one or more managing circuits in communication with the plurality of word lines. The word lines are arranged from lowest to highest from a first end to a second end of the plurality of NAND strings. The one or more managing circuits program the plurality of non-volatile storage elements using a program signal having a pulse width. The one or more managing circuits apply a programming signal for a given program loop having a shorter pulse width when either the lowest or highest word line is selected for programming than the pulse width used to program at least one other word line.

One embodiment includes a method of operating non-volatile storage, comprising the following. Non-volatile storage elements associated with a plurality of word lines in a first block are programmed. The non-volatile storage elements are arranged as a plurality of NAND strings each having a first end and a second end, each of the word lines having a position between the first end and the second end. A final program voltage or a number of program loops that it takes to complete the programming of each of the word lines in the first block is determined. A pulse width duration is determined for each position of the word lines based on the final program voltage or the number of program loops. Word lines in other blocks are programmed using the pulse width duration that was determined for each position.

One embodiment includes a method of operating non-volatile storage having a plurality of NAND strings. Each NAND string may include a plurality of non-volatile storage elements above a channel, a first select transistor at a first end of the NAND string, and a second select transistor at a second end of the NAND string. The first and second select transistors each may have a diffusion region on the opposite side of the select transistor from the channel region. The method comprises applying a voltage to the diffusion region of at least one of the first select transistors. The NAND strings are associated with a plurality of word lines. The magnitude of the voltage applied to the diffusion region depends on the location of a selected word line on the plurality of NAND strings. The method also includes applying a program voltage to the selected word line while applying the voltage to the diffusion region.

One embodiment includes a non-volatile storage device comprising a plurality of NAND strings, a plurality of word lines associated with the plurality of NAND strings, and one or more managing circuits in communication with the plurality of non-volatile NAND strings, and the plurality of word lines. Each NAND string has a plurality of non-volatile storage elements over a channel, a first select transistor at a first end of the NAND string, and a second select transistor at a second end of the NAND string. The first and second select transistors each have a diffusion region on the opposite side of the select transistor from the channel of the NAND string. The one or more managing circuits apply a voltage to the diffusion region of at least one of the first select transistors. The magnitude of the voltage applied to the diffusion region depends on the location of a selected word line on the plurality of NAND strings. The one or more managing circuits apply a program voltage to the selected word line while applying the voltage to the diffusion region of at least one of the first select transistors.

One embodiment includes a method of operating non-volatile storage having a plurality of NAND strings associated with a plurality of word lines. Each of the plurality of NAND strings are associated with a first contact at a first end of a given NAND string and a second contact at a second end of a given NAND string. The method comprises applying a voltage that depends on the location of a selected word line of the plurality of word lines to the first contact associated with at least unselected NAND strings of the plurality of NAND strings; and applying a program voltage to the selected word line while applying the voltage.

One embodiment includes a non-volatile storage device, comprising a plurality of NAND strings, each of the NAND strings have a plurality of non-volatile storage elements, a drain side select transistor, and a source side select transistor; a plurality of word lines associated with the plurality of NAND strings; a common source line coupled to the source side select transistors of the NAND strings; a plurality of bit lines, each of the bit lines is coupled to the drain side select transistor associated with one of the NAND strings; and one or more managing circuits in communication with the plurality of NAND strings, the plurality of word lines, the common source line, and the plurality of bit lines. The one or more managing circuits apply a first voltage that depends on the location of a selected word line of the plurality of word lines to either the bit lines associated with the drain side select transistors of inhibited NAND strings or the source line associated with the source side select transistors. The one or more managing circuits apply a program voltage to the selected word line while applying the first voltage.

One embodiment includes a method of operating non-volatile storage having a plurality of NAND strings and a plurality of word lines associated with the plurality of NAND strings. The method comprises applying a voltage to a common source line having a magnitude that depends on the location of a selected word line on the plurality of NAND strings; and applying a program voltage to the selected word line while applying the voltage to the common source line.

One embodiment includes a method of operating non-volatile storage that includes a plurality of NAND strings and a plurality of word lines. The NAND strings each have a first select transistor at a first end of the NAND string and a second select transistor at a second end of the NAND string. The method comprises applying a voltage to a gate of the first select transistor of a first of the plurality of NAND strings that has a magnitude that depends on the location of a selected word line of the plurality of word lines; and applying a program voltage to the selected word line while applying the voltage to the gate of the first select transistor.

One embodiment includes a non-volatile storage device, comprising a plurality of non-volatile NAND strings, each NAND string having a plurality of non-volatile storage elements and a first select transistor at a first end of the NAND string and a second select transistor at a second end of the NAND string, each of the first and second select transistor having a gate; a plurality of word lines associated with the plurality of NAND strings; a first select line coupled to the gates of the first select transistors; a second select line coupled to the gates of the second select transistors; and one or more managing circuits in communication with the plurality of NAND strings, the plurality of word lines, the first select line, and the second select line. The one or more managing circuits apply a program voltage to a selected word line of the plurality of word lines. The one or more managing circuits apply a voltage to the first select line while applying the program voltage. The voltage applied to the first select line has a magnitude that depends on the location of the selected word line.

One embodiment includes a method of operating non-volatile storage, comprising programming non-volatile storage elements arranged as NAND strings. The NAND strings are associated with a plurality of word lines, a drain side select line, and a source side select line. Each NAND string has a drain side select transistor coupled to the drain side select line and a source side select transistor coupled to the source side select line. The programming includes applying a program voltage to a selected word line of the plurality of word lines, and applying a control voltage to either the drain side select line or the source side select line while applying the program voltage. The control voltage has a magnitude that depends on the location of the selected word line on the plurality of NAND strings.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical application, to thereby enable others skilled in the art to best utilize the various embodiments and with various modifications as are suited to the particular use contemplated. It is intended that the scope be defined by the claims appended hereto.

We claim:

1. A method of operating non-volatile storage, comprising:
   applying a first programming voltage to a first selected word line that has a first duration that depends on the width of the first selected word line; and
   applying a second programming voltage to a second selected word line that has a second duration that depends on the width of the second selected word line, the first selected word line is wider than the second selected word line, the first programming voltage applied to the first selected word line is shorter in duration than the second programming voltage applied to the second selected word line.

2. The method of claim 1, wherein the first selected word line is one of a plurality of word lines associated with a NAND string having a first end and a second end, the first selected word line is at either the first end or the second end of the NAND string.

3. The method of claim 1, wherein the first selected word line is at a source end of a NAND string.

4. The method of claim 1, wherein the first selected word line is at a drain end of a NAND string.

5. The method of claim 1, wherein the first selected word line has a shorter RC time constant than an RC time constant of the second selected word line.

6. The method of claim 1, wherein the first and second selected word lines each have a position between a first end and a second end of a NAND string in a first block, and further comprising:
   determining the duration of the first programming voltage and the second programming voltage based on either a final programming voltage or how many program loops it takes to program a word line at the same position between a first end and a second end of a NAND string in a second block.

7. The method of claim 1, wherein the applying a second programming voltage to the first selected word line and the applying a second programming voltage to the second selected word line is performed when programming non-volatile storage elements associated with a plurality of word lines that include the first and second selected word lines, the non-volatile storage elements are arranged as a plurality of NAND strings, the plurality of word lines are arranged from lowest to highest from a first end to a second end of the plurality of NAND strings, the programming non-volatile storage elements associated with the plurality of word lines includes:

apply a programming signal for a given program loop having a shorter pulse width when either the lowest word line or the highest word line is selected for programming than the pulse width used to program at least one other word line of the plurality of word lines.

8. The method of claim 7, wherein the applying a programming signal for a given program loop is for the initial program loop for the word line being programmed.

9. The method of claim 7, wherein the pulse width used when either the lowest word line or the highest word line is selected for programming is shorter than the pulse width used for programming the majority of the plurality of word lines.

10. A non-volatile storage device, comprising:
a plurality of non-volatile storage elements arranged as NAND strings;
a plurality of word lines associated with the plurality of non-volatile storage elements; and
one or more managing circuits in communication with the plurality of word lines, the one or more managing circuits apply a first programming voltage to a first selected word line of the plurality of word lines, the programming voltage has a first duration that depends on the width of the first selected word line, the one or more managing circuits apply a second programming voltage to a second selected word line of the plurality of word lines, the second programming voltage has a second duration that depends on the width of the second selected word line, the first selected word line is wider than the second selected word line, the first programming voltage applied to the first selected word line is shorter in duration than the second programming voltage applied to the second selected word line.

11. The non-volatile storage device of claim 10, wherein the first selected word line is at either a first end or a second end of a first of the NAND strings.

12. The non-volatile storage device of claim 10, wherein the first selected word line is at an end of the NAND strings having source side select gates.

13. The non-volatile storage device of claim 10, wherein the first selected word line is at an end of the NAND strings having drain side select gates.

14. The non-volatile storage device of claim 10, wherein the first selected word line has a shorter RC time constant than an RC time constant of the second selected word line.

15. The non-volatile storage device of claim 10, wherein the plurality of word lines each have a position between a first end and a second end of the NAND strings, the NAND strings are in a first block, the one or more managing circuits determine a duration for a program voltage for each position based on either a final programming voltage or how many program loops it takes to program a word line at that position between a first end and a second end of a NAND string in a second block.

16. The non-volatile storage device of claim 10, wherein the plurality of word lines are arranged from lowest to highest from a first end to a second end of the NAND strings, wherein the one or more managing circuits program the plurality of non-volatile storage elements using a program signal having a pulse width, the one or more managing circuits apply a programming signal for a given program loop having a shorter pulse width when either the lowest or highest word line is selected for programming than the pulse width used to program at least one other word line.

17. The non-volatile storage device of claim 16, wherein the given program loop is the initial program loop for the word line being programmed.

18. A method of operating non-volatile storage, comprising:
programming non-volatile storage elements associated with a plurality of word lines in a first block, the non-volatile storage elements are arranged as a plurality of NAND strings each having a first end and a second end, each of the word lines having a position between the first end and the second end;
determining a final program voltage or a number of program loops that it takes to complete the programming of each of the word lines in the first block;
determining a pulse width duration for each position of the word lines based on the final program voltage or the number of program loops; and
programming word lines in other blocks using the pulse width duration that was determined for each position.

19. A non-volatile storage device, comprising:
a first block and a second block of non-volatile storage elements arranged as NAND strings, each of the NAND strings having a first end and a second end;
a first plurality of word lines associated with the non-volatile storage elements in the first block, the first plurality of word lines each having a position between the first end and the second end of the NAND strings in the first block;
a second plurality of word lines associated with the non-volatile storage elements in the second block, the second plurality of word lines each having a position between the first end and the second end of the NAND strings in the second block; and
one or more managing circuits in communication with the first plurality of word lines and the second plurality of word lines, the one or more managing circuits determine a final program voltage or a number of program loops that it takes to complete the programming of each of the first plurality of word lines in the first block, the one or more managing circuits determine a pulse width duration for each position of the word lines based on the final program voltage or the number of program loops, the one or more managing circuits program the second plurality of word lines in the second block using the pulse width duration that was determined for each position.

20. The non-volatile storage device of claim 19, wherein the first block and the second block of non-volatile storage elements are part of a three-dimensional memory array.

21. A 3D non-volatile storage device, comprising:
a three-dimensional (3D) memory array of non-volatile storage elements arranged as NAND strings;
a plurality of word lines associated with the non-volatile storage elements; and
one or more managing circuits in communication with the plurality of word lines, the one or more managing circuits apply a first programming voltage to a first selected word line of the plurality of word lines, the programming voltage has a first duration that depends on the width of the first selected word line, the one or more managing circuits apply a second programming voltage to a second selected word line of the plurality of word lines, the second programming voltage has a second duration that depends on the width of the second selected word line, the first selected word line is wider than the second selected word line, the first programming voltage applied to the first selected word line is shorter in duration than the second programming voltage applied to the second selected word line.

* * * * *